United States Patent
Sato

(10) Patent No.: US 9,608,397 B2
(45) Date of Patent: Mar. 28, 2017

(54) LASER PROCESSING DEVICE

(71) Applicant: Keyence Corporation, Osaka (JP)

(72) Inventor: Masao Sato, Osaka (JP)

(73) Assignee: Keyence Corporation, Osaka (JP)

( * ) Notice: Subject to any disclaimer, the term of this patent is extended or adjusted under 35 U.S.C. 154(b) by 0 days.

(21) Appl. No.: 14/791,493

(22) Filed: Jul. 6, 2015

(65) Prior Publication Data

US 2016/0036194 A1 Feb. 4, 2016

(30) Foreign Application Priority Data

Jul. 31, 2014 (JP) .................................. 2014-156572

(51) Int. Cl.
*H01S 3/094* (2006.01)
*H01S 3/067* (2006.01)
(Continued)

(52) U.S. Cl.
CPC .... *H01S 3/094053* (2013.01); *B23K 26/0066* (2013.01); *B23K 26/048* (2013.01); *B23K 26/0608* (2013.01); *B23K 26/0613* (2013.01); *B23K 26/0624* (2015.10); *B23K 26/082* (2015.10); *B23K 26/352* (2015.10); *B23K 26/706* (2015.10); *H01S 3/0085* (2013.01); *H01S 3/067* (2013.01); *H01S 3/0941* (2013.01); *H01S 3/09415* (2013.01);
(Continued)

(58) Field of Classification Search
CPC . H01S 3/11; H01S 3/2308; H01S 3/07; H01S 3/0071; H01S 3/094053; H01S 5/5018; H01S 5/5027; H01S 3/094096; H01S 3/091
See application file for complete search history.

(56) References Cited

U.S. PATENT DOCUMENTS 3,781,531 A * 12/1973 Baker .................... G01N 21/89
250/559.06
5,202,893 A * 4/1993 Kubota ............... H01S 3/09415
372/101

(Continued)

FOREIGN PATENT DOCUMENTS

JP 2006-156834 6/2006
JP 2008-227377 9/2008
(Continued)

*Primary Examiner* — Eric Bolda
(74) *Attorney, Agent, or Firm* — Kilyk & Bowersox, P.L.L.C.

(57) ABSTRACT

Provided is a laser processing device capable of performing high-power laser processing while preventing reduction of life duration of a light source for excitation light. By collecting the light emitted from single emitters of a plurality of single emitter LDs onto one end face of an optical fiber cable, high-power excitation light is transmitted to a marking head through the optical fiber cable. Excitation light emitted from the other end face of the optical fiber cable is separated into first excitation light and second excitation light. The first excitation light excites a first laser medium to generate laser light. The generated laser light enters a second laser medium. The second excitation light enters the second laser medium. With this, the second laser medium is excited, and the laser light that has entered the second laser medium from the first laser medium is amplified.

11 Claims, 10 Drawing Sheets

(51) Int. Cl.

| | | |
|---|---|---|
| *H01S 5/40* | (2006.01) | |
| *B23K 26/04* | (2014.01) | |
| *H01S 3/0941* | (2006.01) | |
| *H01S 3/117* | (2006.01) | |
| *H01S 3/23* | (2006.01) | |
| *H01S 5/14* | (2006.01) | |
| *B23K 26/00* | (2014.01) | |
| *B23K 26/06* | (2014.01) | |
| *B23K 26/082* | (2014.01) | |
| *B23K 26/352* | (2014.01) | |
| *B23K 26/70* | (2014.01) | |
| *B23K 26/0622* | (2014.01) | |
| *H01S 3/00* | (2006.01) | |
| *H01S 3/16* | (2006.01) | |
| *H01S 3/10* | (2006.01) | |
| *H01S 5/00* | (2006.01) | |
| *H01S 5/06* | (2006.01) | |

(52) U.S. Cl.
CPC ............ *H01S 3/117* (2013.01); *H01S 3/2308* (2013.01); *H01S 5/141* (2013.01); *H01S 5/4012* (2013.01); *H01S 5/4018* (2013.01); *H01S 5/4025* (2013.01); *H01S 3/0071* (2013.01); *H01S 3/10061* (2013.01); *H01S 3/1611* (2013.01); *H01S 3/1643* (2013.01); *H01S 3/1673* (2013.01); *H01S 5/0071* (2013.01); *H01S 5/0617* (2013.01); *H01S 5/4062* (2013.01)

(56) References Cited

U.S. PATENT DOCUMENTS

| | | | | |
|---|---|---|---|---|
| 5,212,710 | A * | 5/1993 | Kaneda | G02B 6/2817 359/483.01 |
| 5,541,946 | A * | 7/1996 | Scheps | H01S 3/0823 372/100 |
| 5,666,372 | A * | 9/1997 | Ball | H01S 3/067 372/102 |
| 6,268,956 | B1 * | 7/2001 | Injeyan | H01S 3/2383 359/342 |
| 7,190,705 | B2 * | 3/2007 | Fermann | H01S 3/06754 372/18 |
| 2008/0175296 | A1 * | 7/2008 | Kumkar | H01S 3/07 372/70 |
| 2012/0106581 | A1 * | 5/2012 | Kakui | B23K 26/0063 372/25 |

FOREIGN PATENT DOCUMENTS

| | | |
|---|---|---|
| JP | 2008-227378 | 9/2008 |
| JP | 2008-227379 | 9/2008 |
| JP | 2009-142865 | 7/2009 |

* cited by examiner

LASER PROCESSING DEVICE

CROSS-REFERENCE TO RELATED APPLICATIONS

The present application claims foreign priority based on Japanese Patent Application No. 2014-156572, filed Jul. 31, 2014, the contents of which is incorporated herein by reference.

BACKGROUND OF THE INVENTION

1. Field of the Invention

The present invention relates to a laser processing device.

2. Description of Related Art

Conventionally, there is known a laser marking device for two-dimensionally scanning an object (hereinafter referred to as a workpiece) with laser light and thus providing marking for the workpiece in a desired manner (e.g., JP 2008-62258 A). Such a laser marking device includes an oscillator for amplifying excitation light to generate a laser beam.

In the oscillator described in JP 2008-62258 A, a solid such as YAG (yttrium aluminum garnet) or $YVO_4$ (yttrium vanadate) is used as a laser medium.

A gas such as $CO_2$ (carbon dioxide) may also be used as a laser medium of the oscillator. A laser marking device having an oscillator using a solid-state laser medium has become widely used, as its oscillator is small in size and provides high output power.

In recent years, in the fields of laser marking devices, there is a demand for higher output power for laser light used in marking, in order to provide marking for a large number of workpieces in a short period of time (reduction of takt time).

In order to achieve higher output power for laser light, it is conceivable, for example, to provide an amplifier including a laser medium after the oscillator described above, and amplify laser light generated by the oscillator by the amplifier. In this case, both of the two laser media of the oscillator and the amplifier have to be excited. Therefore, it is necessary to increase output power of an excitation light source for exciting these two laser media.

In the laser marking device described in JP 2008-62258 A, an LD (laser diode) array having a plurality of emitters (light emitting spots) is used as an excitation light source. However, as the number of the emitters in the LD array is limited, there is also a limitation in increasing output power of the excitation light source to be higher. Further, the LD array is inherently configured such that the plurality of emitters are adjacent to each other. Accordingly, radiation performance of the LD array is poor. Therefore, when the density of the disposed emitters and the number of the emitters are increased, heat generated during driving makes life duration of the LD array shorter.

SUMMARY OF THE INVENTION

An object of the present invention is to provide a laser processing device capable of performing high-power laser processing while preventing reduction of life duration of a light source for excitation light.

(1) A laser processing device according to the present invention is a laser processing device for processing an object by irradiating the object with laser light, the device including: an excitation light generating unit configured to emit excitation light; an excitation light transmission medium having one end and the other end, and configured to transmit the excitation light emitted from the excitation light generating unit from the one end to the other end; a laser light output unit configured to emit laser light based on the excitation light transmitted through the excitation light transmission medium; and a laser light scanning unit configured to scan the laser light emitted from the laser light output unit over a surface of the object, wherein the excitation light generating unit includes: a plurality of light sources each having a single light emitting spot for emitting excitation light; and a light collection optical mechanism configured to collect the excitation light emitted from the light emitting spots of the plurality of light sources onto the one end of the excitation light transmission medium, and the laser light output unit includes: an excitation light separator configured to separate the excitation light emitted from the other end of the excitation light transmission medium into first excitation light and second excitation light; an oscillator having a first laser medium excited by the first excitation light separated by the excitation light separator, the oscillator configured to emit, as the laser light, induced emission light generated in the first laser medium; and an amplifier having a second laser medium excited by the second excitation light separated by the excitation light separator, the amplifier configured to amplify the laser light emitted from the oscillator by the second laser medium.

According to such a laser processing device, the excitation light emitted from the single light emitting spots of the plurality of light sources of the excitation light generating unit is collected onto one end of the excitation light transmission medium by the light collection optical mechanism. In this case, the plurality of light sources each having a single light emitting spot can be arranged in a dispersed manner. By arranging the light sources in a dispersed manner, heat generated during driving may be easily radiated. This prevents life duration of the light sources from becoming shorter due to heat generation. Further, by collecting the excitation light emitted from the plurality of light sources onto one end of the excitation light transmission medium, the high-power excitation light is transmitted to the laser light output unit through the excitation light transmission medium.

In the laser light output unit, the excitation light emitted from the other end of the excitation light transmission medium is separated into the first excitation light and the second excitation light by the excitation light separator. By the first excitation light exciting the first laser medium, the induced emission light generated in the first laser medium is emitted from the oscillator as the laser light. Further, by the second excitation light exciting the second laser medium, the laser light emitted from the oscillator is amplified by the amplifier.

In this case, as an output of the first excitation light is lower than an output of the excitation light collected onto one end of the excitation light transmission medium, an occurrence of a thermal lens effect in the first laser medium is prevented. Further, as the laser light generated from the first laser medium is effectively amplified by the second excitation light, an output of the laser light emitted from the laser light output unit increases. Therefore, the high-power laser light is scanned over a surface of the object by the laser light scanning unit. As a result, it is possible to perform laser processing by high-power laser light while preventing life duration of the light sources of excitation light from becoming shorter.

(2) The plurality of light sources of the excitation light generating unit may be connected in series. In this case, it is possible to reduce an electric current supplied to the plurality of light sources as compared to a case in which the plurality of light sources are connected in parallel. With this, it is possible to make a wire connecting the power unit with the plurality of light sources to be thinner. Accordingly, a degree of freedom for a layout of the wiring increases.

(3) The excitation light generating unit may further include: a casing for containing the plurality of light sources and the light collection optical mechanism, and the plurality of light sources and the light collection optical mechanism may be fixed within the casing.

In this case, the plurality of light sources and the light collection optical mechanism can be accurately positioned within the casing. Further, as the plurality of light sources and the light collection optical mechanism may be treated as a single unit, assembly of the laser processing device is facilitated.

(4) The excitation light generating unit may further include: a plurality of volume bragg gratings provided for the respective light sources, and the volume bragg gratings may each function as an external resonator of corresponding one of the light sources by reflecting excitation light in a previously determined wavelength region.

In this case, even when there is variation in wavelengths of the excitation light emitted from the light sources due to the temperature and such, the wavelength of the excitation light emitted through the volume Bragg grating is restricted within the previously determined wavelength region. Therefore, by the previously determined wavelength region including an excitation wavelength of the first laser medium, it is possible to efficiently excite the first laser medium.

(5) The previously determined wavelength region may be a wavelength region of a constant width and including 879 nm, and the first laser medium may generate laser light whose wavelength is 1064 nm based on excitation light whose wavelength is 879 nm.

In this case, it is possible to emit the laser light from the oscillator with high quantum efficiency. With this, it is possible to reduce heat generated from the first laser medium when the laser light is emitted. Further, by the reduction of the heat generation, an occurrence of a thermal lens effect in the first laser medium can be prevented. Therefore, it is possible to cause the laser light having a desired beam diameter and a desired intensity distribution to be emitted stably from the laser light output unit.

(6) The laser processing device may further include: a main body including the excitation light generating unit; and a head provided separately from the main body, wherein the head may include the laser light output unit and the laser light scanning unit, and the excitation light transmission medium may be an optical fiber cable connecting the main body and the head such that the excitation light generated by the excitation light generating unit is transmitted to the laser light output unit.

In this case, the excitation light emitted from the excitation light generating unit of the main body is transmitted to the laser light output unit of the head via the optical fiber cable. At the head, the laser light is emitted from the laser light output unit based on the transmitted excitation light, and the emitted laser light is scanned over the surface of the object. According to this configuration, it is possible to downsize the head that emits laser light.

(7) The first laser medium may include: a first end and a second end each capable of emitting laser light, and the oscillator may include: a first reflecting member disposed so as to reflect the laser light emitted from the second end of the first laser medium toward the second end; a second reflecting member disposed so as to reflect the laser light emitted from the first end of the first laser medium toward the first end; and a Q switch disposed along a path of laser light between the first reflecting member and the second reflecting member.

In this case, it is possible to cause pulse oscillation of the laser light by the Q switch. With this, it is possible to emit the high-power laser light with a short pulse width. Therefore, the surface of the object can be irradiated with the high-power laser light at very small time intervals. With this, it is possible to reduce time for processing the object by the laser light.

(8) The second laser medium of the amplifier may include: a third end and a fourth end, and the laser light output unit may further include: a first optical element configured to receive the laser light emitted from the oscillator through the third end of the second laser medium and emit the received laser light through the fourth end of the second laser medium; and a second optical element configured to receive the second excitation light separated by the excitation light separator through the fourth end of the second laser medium.

In this case, the laser light emitted from the oscillator enters the third end and emitted from the fourth end of the second laser medium. The second excitation light enters the fourth end of the second laser medium. With this, in the second laser medium, it is possible to amplify the laser light more effectively as compared to a case in which the second excitation light enters the third end. Further, it is possible to improve a degree of freedom for a layout of the first optical element and the second optical element within the laser light output unit, and thus assembly of the laser processing device can be facilitated.

(9) The laser light output unit may further include: a third optical element configured to reflect the laser light emitted from the fourth end of the second laser medium toward the laser light scanning unit. With this, it is possible to direct the laser light amplified by the second laser medium to the laser light scanning unit with a simple configuration.

(10) The laser processing device may further include: a focal position adjusting unit provided between the laser light output unit and the laser light scanning unit, wherein the focal position adjusting unit may include: a first lens and a second lens provided along a path of laser light from the laser light output unit to the laser light scanning unit; and a lens moving unit configured to adjust a focal position of the laser light applied to the object by changing a relative distance between the first lens and the second lens.

In this case, the focal position of the laser light applied to the object can be adjusted by changing the relative distance between the first lens and the second lens of the focal position adjusting unit. With this, it is possible to focus the high-power laser light on the surface of the object. As a result, it is possible to reduce time for laser processing and to improve accuracy in laser processing.

(11) According to the laser processing device of the present invention, as described above, in the laser light output unit, the excitation light emitted from the other end of the excitation light transmission medium is separated (or branched) into the first excitation light and the second excitation light by the excitation light separator. Here, the excitation light emitted from the excitation light generating unit may be transmitted to the laser light output unit through a single (one) excitation light transmission medium.

In this case, when exciting the second laser medium provided for the amplifier, it is possible to effectively use a part of the high-power excitation light transmitted through the single (one) excitation light transmission medium. With this, it is not necessary to separately provide an excitation light source for exciting the second laser medium within the laser light output unit, and the number of the components within the laser light output unit can be reduced. Thus, it is possible to simplify an internal structure of the laser light output unit, as well as to facilitate assembly of the laser processing device.

Further, when a device that requires an excitation light source separately provided within the laser light output unit is considered, it is not possible to maintain a function as the laser processing device if the excitation light source goes out of order. By contrast, according to the laser processing device of the present invention, as the excitation light generating unit for generating the excitation light is provided with the plurality of light sources, it is possible to maintain the function as the laser processing device even if one of these light sources goes out of order, and thus to improve convenience of the laser processing device.

According to the present invention, it is possible to perform high-power laser processing while preventing reduction of life duration of a light source for excitation light.

DETAILED DESCRIPTION OF PREFERRED EMBODIMENTS

Hereinafter, a laser processing device according to one embodiment of the present invention will be described with reference to the drawings. In the following description, a laser marking device for performing marking (printing) to an object (hereinafter referred to as a workpiece) by scanning the workpiece with laser light will be described as one example of the laser processing device.

(1) Schematic Configuration of Laser processing System

Figure 1:
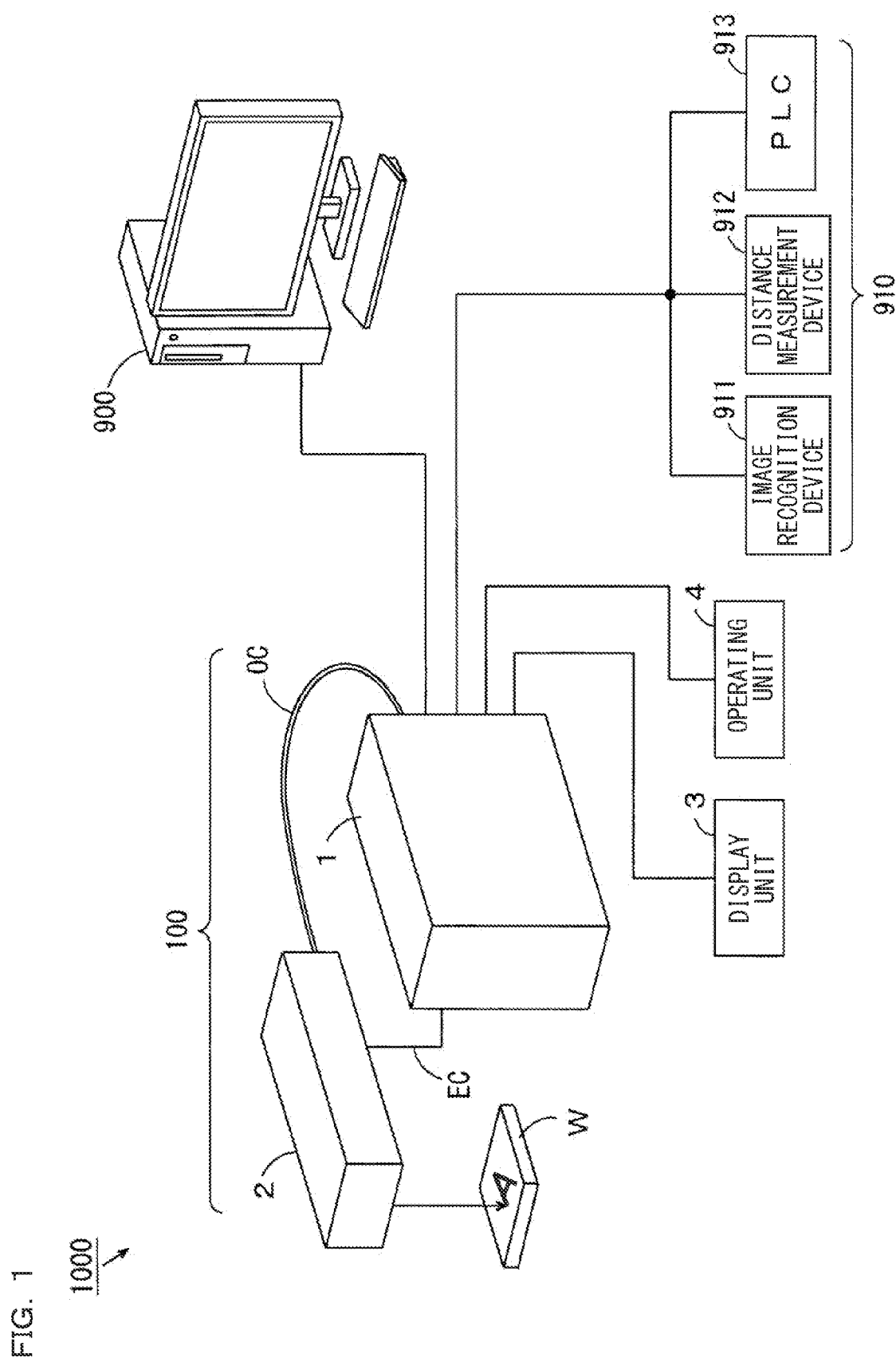
FIG. 1 is a block diagram illustrating a schematic configuration of a laser processing system according to one embodiment of the present invention.

FIG. 1 is a block diagram illustrating a schematic configuration of a laser processing system according to one embodiment of the present invention. As illustrated in FIG. 1, a laser processing system 1000 includes a laser marking device 100, a laser processing data setting device 900, and a plurality of external devices 910.

The laser marking device 100 includes a main body 1, a marking head 2, a display unit 3, and an operating unit 4. The main body 1 and the marking head 2 are connected with each other via one electric cable EC and one optical fiber cable OC. The length of the optical fiber cable OC is 2 m or longer, for example. In the laser marking device 100, excitation light is generated by the main body 1. The generated excitation light is transmitted to the marking head 2 via the optical fiber cable OC. The excitation light transmitted to the marking head 2 enters a first laser medium LM1 and a second laser medium LM2 (FIG. 5), which will be described later, in the marking head 2. With this, a resonator including the first laser medium LM1 generates laser light. Then, the generated laser light is amplified by the second laser medium LM2. The amplified laser light is applied to a workpiece W. Marking to the workpiece W is performed by scanning laser light over the workpiece W based on laser processing data that has previously been set. A configuration of the main body 1 and the marking head 2 will be described later in detail.

The display unit 3 is configured, for example, as a liquid crystal display panel or an organic EL (electroluminescence) panel, and connected to the main body 1. The display unit 3 displays various kinds of information based on the laser processing data. The various kinds of information include information such as operating conditions of the laser marking device 100 and images and letters to be marked.

The operating unit 4 includes a keyboard and a pointing device, and is connected to the main body 1. Examples of the pointing device include a mouse and a joystick. The operating unit 4 is operated by a user such as when marking to the workpiece W is performed by the laser marking device 100.

The laser processing data setting device 900 includes, for example, a CPU (central processing unit) and a memory, or a microcomputer, and is connected to the main body 1. The laser processing data setting device 900 also includes a display unit and an operating unit. With the laser processing data setting device 900, the laser processing data is generated based on operations of the operating unit by the user. The laser processing data includes information such as marking patterns, laser light output used for marking, scanning speed of laser light over the workpiece W, and a drive frequency of a Q switch 50Q (FIG. 5) that will be later described. The generated laser processing data is supplied to the main body 1.

The plurality of external devices 910 are connected to the main body 1 of the laser marking device 100 as needed. In the example shown in FIG. 1, an image recognition device 911, a distance measurement device 912, and a PLC (programmable controller) 913 are illustrated as the plurality of external devices 910.

The image recognition device 911 is used, for example, to determine a type and a position of the workpiece W that is carried along a line. As the image recognition device 911, an image sensor or the like may be used. The distance measurement device 912 is used, for example, to measure a distance between the workpiece W and the marking head 2.

Further, the PLC 913 is used to control devices external to the laser processing system 1000 according to a previously determined sequence.

(2) Main Body

Figure 2:
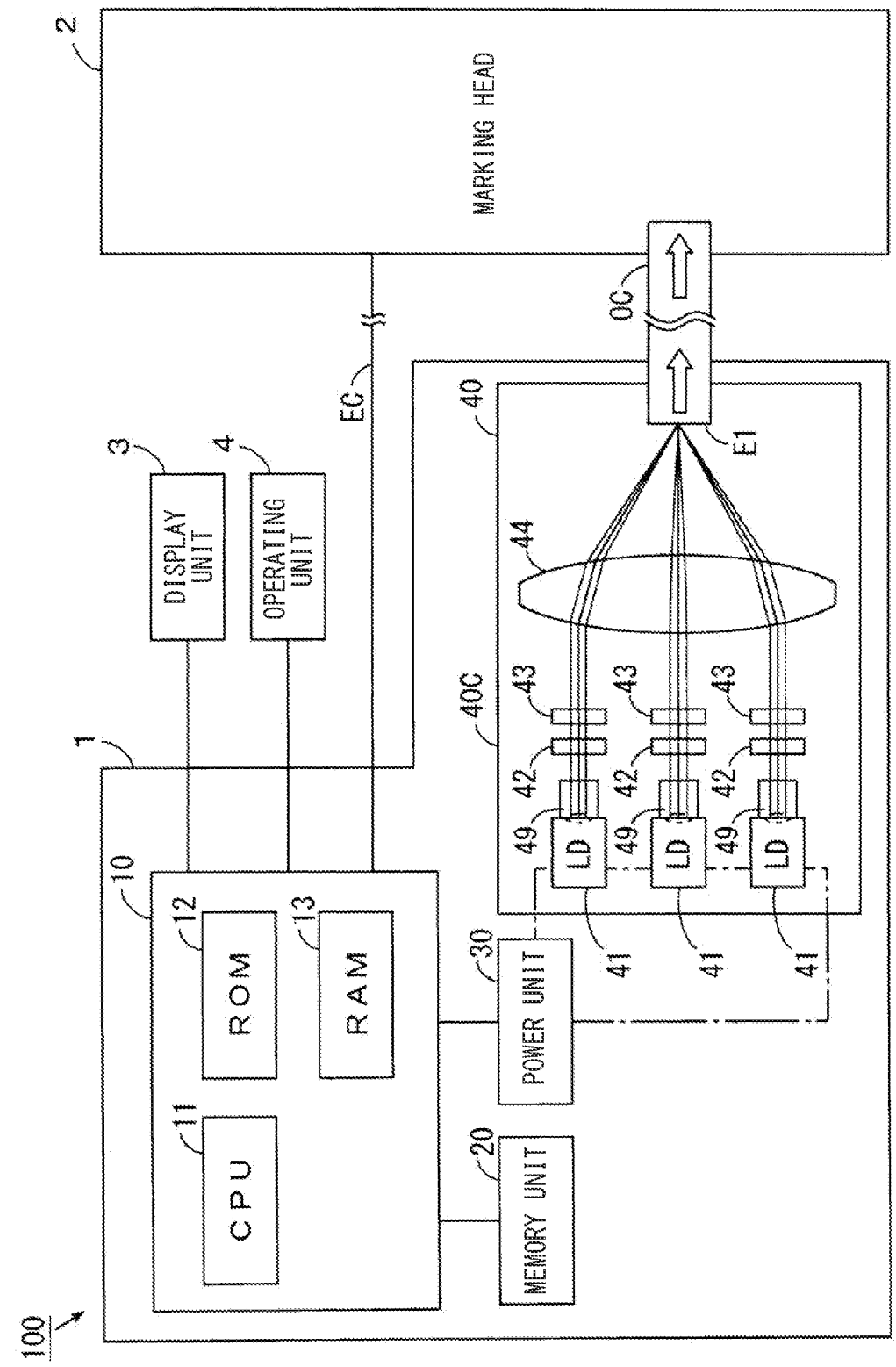
FIG. 2 is a block diagram for illustrating a configuration of a main body shown in FIG. 1.

FIG. 2 is a block diagram for illustrating a configuration of the main body 1 shown in FIG. 1. As shown in FIG. 2, the main body 1 includes a control unit 10, a memory unit 20, a power unit 30, and a laser excitation unit 40.

The control unit 10 includes a CPU (central processing unit) 11, a ROM (read only memory) 12, and a RAM (random access memory) 13. The ROM 12 stores, for example, control programs for the CPU 11. The RAM 13 stores various data, and functions as a work area for the CPU 11. The CPU 11 executes the control programs stored in the ROM 12.

The memory unit 20 is configured, for example, as a hard disk or a memory card. The memory unit 20 stores the laser processing data supplied from the laser processing data setting device 900 shown in FIG. 1. With this, the laser processing data is set in the main body 1. In this case, the CPU 11 controls the power unit 30, the laser excitation unit 40, and the marking head 2 based on the set laser processing data.

The laser excitation unit 40 includes a casing 40C, a plurality of (3 in this example) single emitter LDs (laser diode) 41, a plurality of (3 in this example) VBGs (volume bragg gratings) 49, a plurality of (3 in this example) fast axis collimator lenses 42, a plurality of (3 in this example) slow axis collimator lenses 43, and one light collection lens 44. Further, to the laser excitation unit 40, one end of the optical fiber cable OC for connecting the main body 1 and the marking head 2 is connected. In this embodiment, the single emitter LDs 41 are laser diodes each having a single emitter (light emitting spot). FIG. 2 shows a configuration of the laser excitation unit 40 in a schematic plan view. FIG. 2 also shows single emitters of the respective single emitter LDs 41 by dotted lines.

The plurality of single emitter LDs 41, the plurality of VBGs 49, the plurality of fast axis collimator lenses 42, the plurality of slow axis collimator lenses 43, and the one light collection lens 44 are fixed within the casing 40C.

In the example shown in FIG. 2, the three single emitter LDs 41 are disposed such that directions (hereinafter referred to as an emitting direction) of light emitted from the three single emitter LDs 41 are parallel to each other, and that the three single emitter LDs 41 are arranged at regular intervals along a direction orthogonal to the emitting direction. A distance between adjacent ones of the single emitter LDs 41 is set, for example, to a value between 1 mm and 20 mm, inclusive. If the distance between the single emitter LDs 41 is greater than 20 mm, it is difficult to contain the single emitter LDs 41 in a case with a reduced size. By contrast, if this distance is smaller than 1 mm, it is difficult to obtain an effect of radiation performance. Thus, in order to support both improvement in radiation performance and size reduction, it is preferable to set the distance between the single emitter LDs 41 to around 5 mm.

As described above, by arranging the plurality of single emitter LDs 41 in a dispersed manner, heat generated by the single emitter LDs 41 when the plurality of single emitter LDs 41 are driven can be easily radiated. This prevents life duration of the single emitter LDs 41 from becoming shorter due to heat generation.

The VBGs 49 are provided at the front of the respective single emitter LDs 41. The VBGs 49 reflect light in a previously determined wavelength region out of light emitted from the single emitter LDs 41, and thus function as external resonators for the respective single emitter LDs 41. With this, a wavelength of light emitted from the single emitter LDs 41 through the VBGs 49 is restricted within the previously determined wavelength region. The previously determined wavelength region includes an excitation wavelength of the first laser medium LM1.

In this case, even when the wavelength of the light emitted from the single emitter LDs 41 changes due to a change in the temperature of the single emitter LDs 41, the light in the previously determined wavelength region is emitted from the single emitter LDs 41. In this embodiment, the previously determined wavelength region is set to be a range of a certain width centering 879 nm. The wavelength of the light emitted from the single emitter LDs 41 through the VBGs 49 is mainly 879 nm.

The fast axis collimator lenses 42 and the slow axis collimator lenses 43 are disposed side by side in the stated order in front of the respective VBGs 49 provided for the single emitter LDs 41. The fast axis collimator lenses 42 and the slow axis collimator lenses 43 change the light emitted from the single emitter LDs 41 into collimated light.

The light collection lens 44 is disposed in front of the plurality of slow axis collimator lenses 43 such that the light emitted from all of the single emitter LDs 41 enters the lens. The light collection lens 44 collects the light emitted from all of the single emitter LDs 41 onto a one end face E1 of the optical fiber cable OC. The light at the one end face E1 of the optical fiber cable OC is transmitted to the marking head 2 as high-power excitation light.

As shown by alternate long and short dash lines in FIG. 2, the plurality of single emitter LDs 41 in the laser excitation unit 40 are connected in series. The power unit 30 supplies electric power to a series circuit including the plurality of single emitter LDs 41 so that a total output (energy) of the light emitted from the plurality of single emitter LDs 41 is 50 W or more, for example.

In this case, it is possible to reduce an electric current supplied to the plurality of single emitter LDs 41 as compared to a case in which the plurality of single emitter LDs 41 are connected in parallel. With this, it is possible to make a wire connecting the power unit 30 with the plurality of single emitter LDs 41 to be thinner. Accordingly, a degree of freedom for a layout of the wiring increases. In this embodiment, a value of the electric current supplied to the series circuit including the plurality of single emitter LDs 41 is 15 A, for example.

For the laser excitation unit 40, the configuration for collecting the light emitted from the plurality of single emitter LDs 41 to the one end face E1 of the optical fiber cable OC is not limited to the example shown in FIG. 2. The laser excitation unit 40 may have a configuration as described below.

Figure 3:
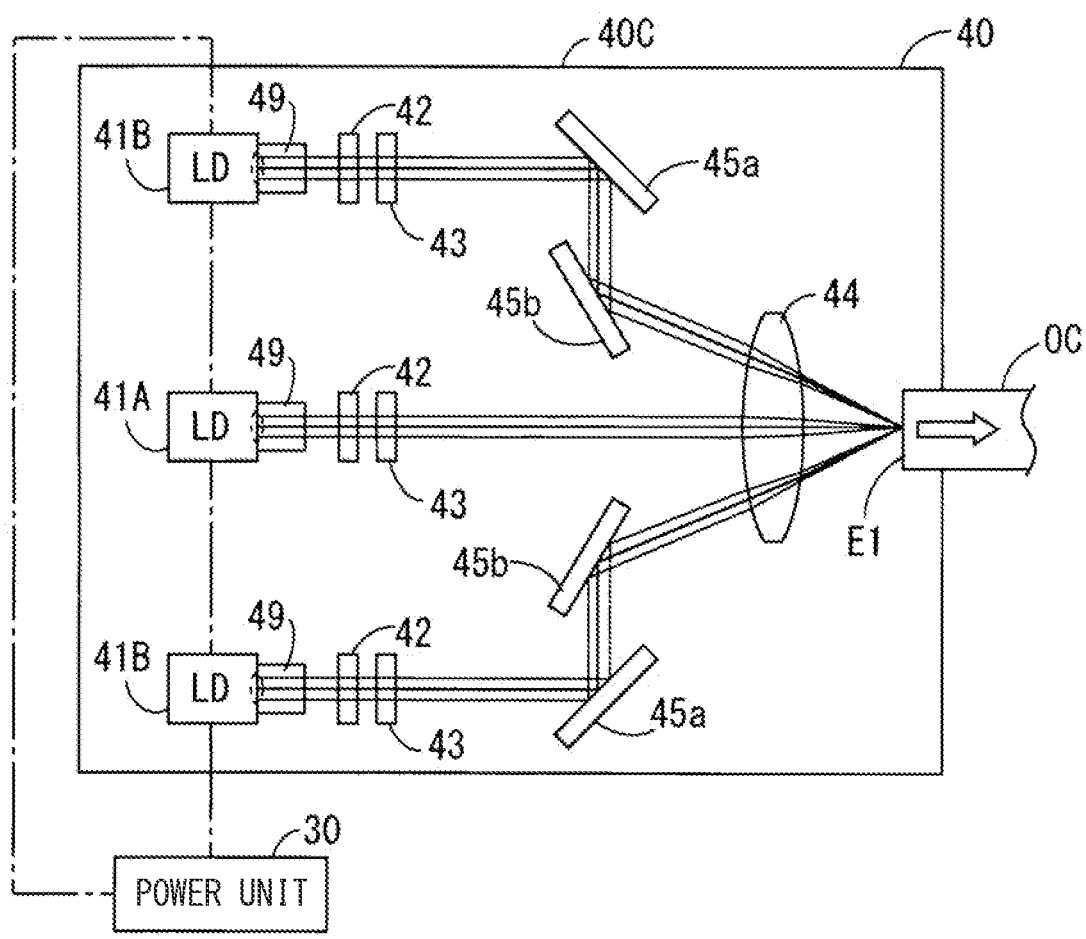
FIG. 3 is a schematic plan view illustrating another example of a configuration of a laser excitation unit.

FIG. 3 is a schematic plan view illustrating another example of the configuration of the laser excitation unit 40. The laser excitation unit 40 shown in FIG. 3 further includes a plurality of total reflection mirrors 45a and 45b, in addition to the light collection lens 44.

Here, in FIG. 3, one of the single emitter LDs 41 along an optical axis of the light collection lens 44 is referred to as a first single emitter LD 41A, and two of the single emitter LDs 41 disposed so as to sandwich the first single emitter LD 41 are referred to as second single emitter LDs 41B.

The total reflection mirror 45a is disposed in front of each of the second single emitter LDs 41B. Further, the total reflection mirror 45b is disposed in a direction from the total reflection mirror 45a orthogonal to the emitting direction.

The light emitted from the first single emitter LD 41A enters the light collection lens 44 along the optical axis of the light collection lens 44, and is collected onto the one end face E1 of the optical fiber cable OC.

On the other hand, the light emitted from the second single emitter LDs 41B is reflected upon the total reflection mirrors 45a and 45b so as to be directed toward the one end face E1 of the optical fiber cable OC, and enters the light collection lens 44. The light that has entered the light collection lens 44 is collected onto the one end face E1 of the optical fiber cable OC. In this case, it is possible to downsize the light collection lens 44 while a large distance is ensured between the adjacent single emitter LDs 41.

Figure 4A:
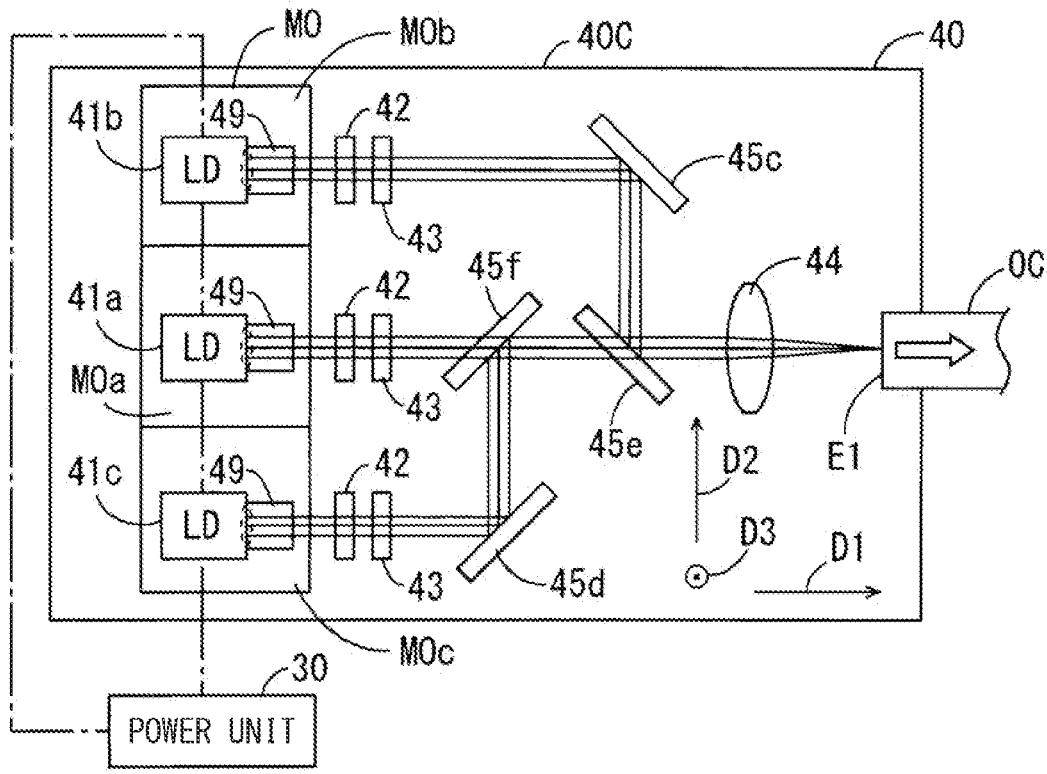
FIG. 4A is a schematic plan view illustrating yet another example of the configuration of the laser excitation unit.
Figure 4B:
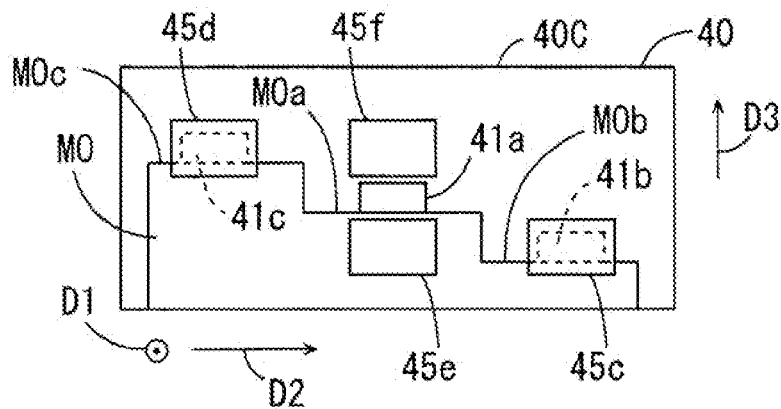
FIG. 4B is a diagram mainly illustrating single emitter LDs shown in FIG. 4A viewed from a position of a light collection lens.
Figure 4C:
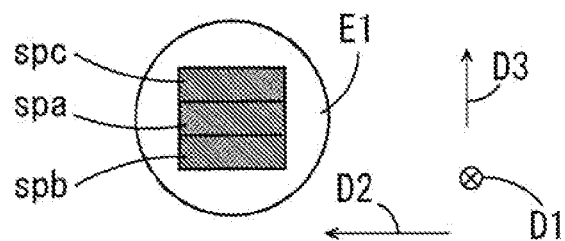
FIG. 4C is a diagram illustrating a light collecting state at one end face of an optical fiber cable shown in FIG. 4A.

FIG. 4A is a schematic plan view illustrating yet another example of the configuration of the laser excitation unit 40, FIG. 4B is a diagram mainly illustrating single emitter LDs 41a, 41b, and 41c shown in FIG. 4A viewed from a position of the light collection lens 44, and FIG. 4C is a diagram illustrating a light collecting state at the one end face E1 of the optical fiber cable OC shown in FIG. 4A.

In FIGS. 4A to 4C, a direction of the light emitted from the three single emitter LDs 41a, 41b, and 41c is indicated by an arrow D1 as a first direction (the direction corresponding to the emitting direction). Further, a direction orthogonal to the first direction D1 is indicated by an arrow D2 as a second direction. Moreover, a direction orthogonal to the first direction D1 and the second direction D2 is indicated by an arrow D3 as a third direction.

The laser excitation unit 40 shown in FIGS. 4A to 4C further includes a plurality of total reflection mirrors 45c, 45d, 45e, and 45f, and a base MO in addition to the light collection lens 44. Here, in FIGS. 4A to 4C, one of the single emitter LDs 41 along the optical axis of the light collection lens 44 is referred to as a first single emitter LD 41a. Out of two of the single emitter LDs 41 disposed so as to sandwich the first single emitter LD 41, one is referred to as a second single emitter LD 41b, and the other is referred to as a third single emitter LD 41c.

Out of the plurality of components constituting the laser excitation unit 40, FIG. 4B only shows the first single emitter LD 41a to the third single emitter LD 41c, the plurality of total reflection mirrors 45c to 45f, the base MO, and the casing 40C.

As illustrated in FIGS. 4A and 4B, the base MO has three placement surfaces MOb, MOa, and MOc provided in a stepped manner. The placement surfaces MOb, MOa, and MOc are disposed in the stated order along the second direction D2, and are orthogonal to the third direction D3. In the third direction D3, a level of the placement surface MOc is higher than those of the placement surfaces MOa and MOb. Further, the level of the placement surface MOa is higher than that of the placement surface MOb.

The second single emitter LD 41b, the first single emitter LD 41a, and the third single emitter LD 41c are placed on the placement surfaces MOb, MOa, and MOc of the base MO, respectively. Lengths of the second single emitter LD 41b, the first single emitter LD 41a, and the third single emitter LD 41c in this example are longer in the second direction D2 than in the third direction D3.

In front of the second single emitter LD 41b, the one total reflection mirror 45c is disposed. Further, the one total reflection mirror 45e is disposed at a position displaced in the second direction D2 from the position of the total reflection mirror 45c. The total reflection mirror 45e is disposed so as to overlap with the optical axis of the light collection lens 44 when the laser excitation unit 40 is viewed along the third direction D3.

In front of the third single emitter LD 41c, the one total reflection mirror 45d is disposed. Further, the one total reflection mirror 45f is disposed at a position displaced in the second direction D2 from a position of the total reflection mirror 45d. The total reflection mirror 45f is disposed so as to overlap with the optical axis of the light collection lens 44 when the laser excitation unit 40 is viewed along the third direction D3.

The light emitted from the first single emitter LD 41a enters the light collection lens 44 along the optical axis of the light collection lens 44, and is collected onto the one end face E1 of the optical fiber cable OC. FIG. 4C shows a spot, indicated by a reference spa, of the light from the first single emitter LD 41a and collected onto the one end face E1.

On the other hand, the light emitted from the second single emitter LD 41b is reflected upon the total reflection mirror 45c, and then upon the total reflection mirror 45e. The light that has been reflected upon the total reflection mirror 45e enters the light collection lens 44, and is collected onto the one end face E1 of the optical fiber cable OC. FIG. 4C shows a spot, indicated by a reference spb, of the light from the second single emitter LD 41b and collected onto the one end face E1 of the optical fiber cable OC.

By contrast, the light emitted from the third single emitter LD 41c is reflected upon the total reflection mirror 45d, and then upon the total reflection mirror 45f. The light that has been reflected upon the total reflection mirror 45f enters the light collection lens 44, and is collected onto the one end face E1 of the optical fiber cable OC. FIG. 4C shows a spot, indicated by a reference spc, of the light from the third single emitter LD 41c and collected onto the one end face E1 of the optical fiber cable OC.

As described above, when the length of the emitter in the second direction D2 is longer than that in the third direction D3, the light collection spots formed on the one end face E1 of the optical fiber cable OC are also larger in the second direction D2 than in the third direction D3.

Therefore, in this example, the first single emitter LD 41a, the second single emitter LD 41b, the third single emitter LD 41c, and the plurality of total reflection mirrors 45c, 45d, 45e, and 45f are disposed so that the light collection spots spa, spb, and spc are arranged along the third direction D3. With this, it is possible to direct light more efficiently to a wider area on the circular one end face E1 of the optical fiber cable OC. Further, in this embodiment, similarly to the example shown in FIG. 3, it is possible to downsize the light collection lens 44 while a large distance is ensured between the adjacent single emitter LDs 41.

(3) Marking Head

Figure 5:
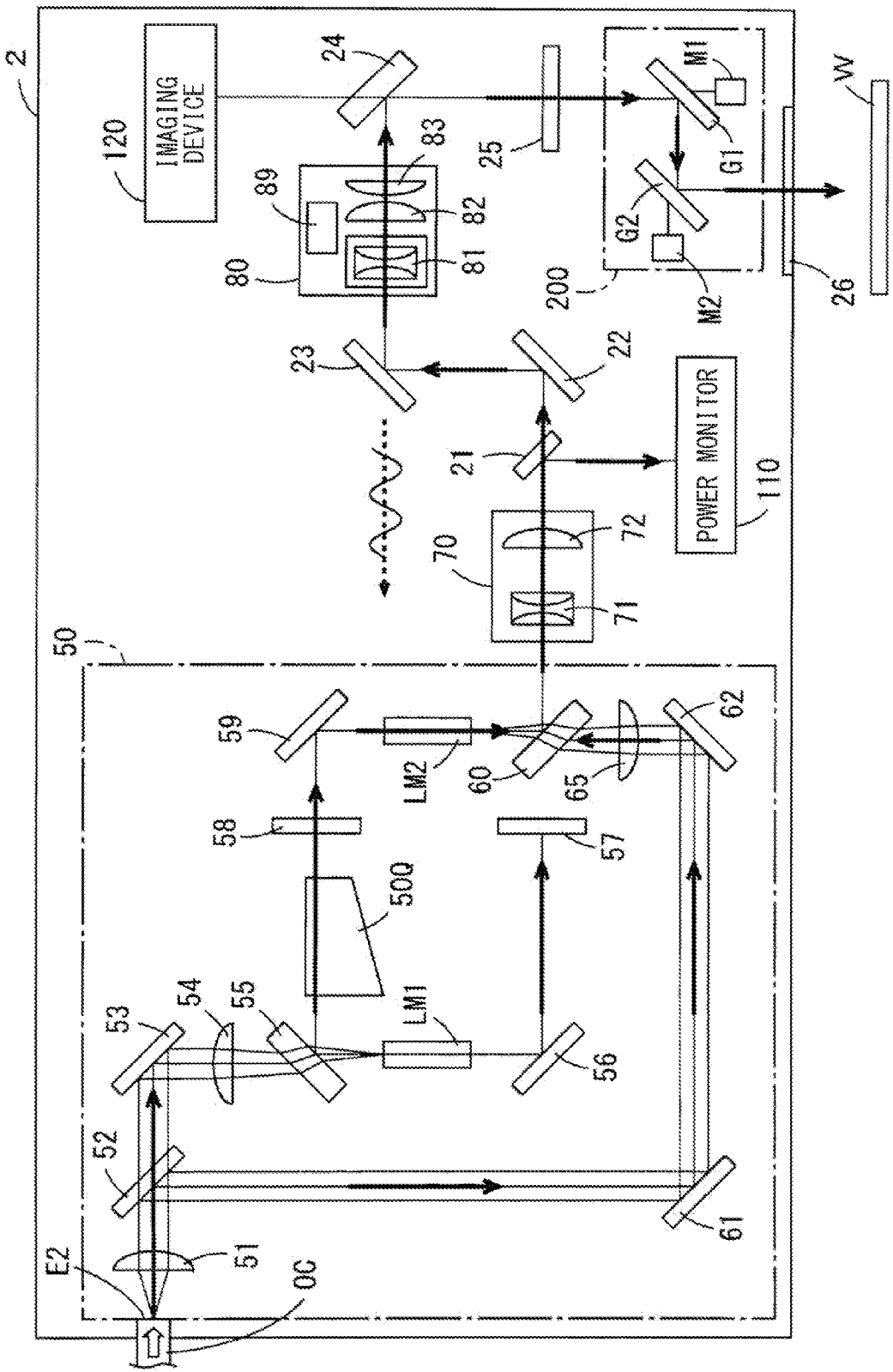
FIG. 5 is a block diagram for illustrating a configuration of a marking head shown in FIG. 1.

FIG. 5 is a block diagram for illustrating a configuration of the marking head 2 shown in FIG. 1. As shown in FIG. 5, the marking head 2 includes a laser light output unit 50, a beam expander 70, a beam sampler 21, a bend mirror 22, a polarizing beam splitter 23, a focal position adjusting unit 80, a turning-back mirror 24, a quarter wave plate 25, a scanning unit 200, a cover glass 26, a power monitor 110, and an imaging device 120.

The other end face E2 of the optical fiber cable OC is connected to the laser light output unit 50. In the laser light output unit 50, laser light to be applied to the workpiece W is generated based on high-power excitation light transmitted from the laser excitation unit 40 of the main body 1 (FIG. 2). The laser light output unit 50 will be described in detail.

As shown in FIG. 5, the laser light output unit 50 includes a collimator lens 51, a beam splitter 52, turning-back mirrors 53, 55, 56, 59, 60, 61, and 62, light collection lenses 54 and

65, a rear mirror 57, an output mirror 58, the Q switch 50Q, the first laser medium LM1, and the second laser medium LM2.

The high-power excitation light emitted from the other end face E2 of the optical fiber cable OC is adjusted into collimated light by the collimator lens 51, and enters the beam splitter 52. The excitation light that has entered the beam splitter 52 is separated into two directions that are orthogonal to each other.

A part of the excitation light separated by the beam splitter 52 is reflected upon the turning-back mirror 53, and then enters the turning-back mirror 55 while being collected by the light collection lens 54. The turning-back mirror 55 is a mirror transmitting light entering one side and reflecting light entering the other side. In this example, excitation light entering the turning-back mirror 55 from the light collection lens 54 passes the turning-back mirror 55 and enters one end of the first laser medium LM1.

The excitation light that has entered the one end of the first laser medium LM1 causes the first laser medium LM1 to generate spontaneously emitted light (or induced emission light). The generated spontaneously emitted light is emitted from the other end of the first laser medium LM1. The spontaneously emitted light that has been emitted from the other end of the first laser medium LM1 is reflected upon the turning-back mirror 56 and then upon the rear mirror 57, and enters the other end of the first laser medium LM1.

The spontaneously emitted light that has entered the other end of the first laser medium LM1 causes the first laser medium LM1 to generate induced emission light. The generated induced emission light is emitted from the one end of the first laser medium LM1. The induced emission light emitted from the one end of the first laser medium LM1 is reflected upon the turning-back mirror 55, and then enters the output mirror 58 through the Q switch 50Q. The output mirror 58 transmits a part of the entered induced emission light, and reflects the remaining part of the induced emission light. The induced emission light that has been reflected upon the output mirror 58 is reflected upon the turning-back mirror 55 through the Q switch 50Q, and enters the one end of the first laser medium LM1. Thereafter, the induced emission light is emitted from the other end of the first laser medium LM1, reflected upon the turning-back mirror 56 and then upon the rear mirror 57, and enters the other end of the first laser medium LM1.

By the induced emission light repeatedly entering the first laser medium LM1 in this manner, laser light is generated from the first laser medium LM1.

Here, $Nd:YVO_4$ (neodymium:yttrium vanadate) or Nd:YAG (yttrium aluminum garnet) is used as the first laser medium LM1 and the second laser medium LM2. In this case, a wavelength of the laser light generated from the first laser medium LM1 is 1064 nm. As described above, the light emitted from the single emitter LDs 41 through the VBGs 49 mainly has a wavelength of 879 nm. In other words, the wavelength of the excitation light is 879 nm. Therefore, a quantum efficiency of the first laser medium LM1 is about 83%.

As described above, the first laser medium LM1 generates laser light with high quantum efficiency. With this, heat generated from the first laser medium LM1 when the laser light is generated is reduced, and thus an occurrence of a thermal lens effect is prevented.

The lengths of crystals of the first laser medium LM1 and the second laser medium LM2 are 10 mm or longer, and more preferably, 15 mm or longer. Further, the first laser medium LM1 and the second laser medium LM2 are arranged such that crystals of the both laser media are parallel with each other in a c-axial direction.

In this embodiment, the turning-back mirrors 55 and 56, the rear mirror 57, the output mirror 58, the Q switch 50Q, and the first laser medium LM1 function as an oscillator of laser light. With the oscillator, pulse oscillation of the laser light is caused by applying a high-frequency drive signal to the Q switch 50Q by a driving device that is not depicted. As the Q switch 50Q, an AOM (Acousto-Optic Modulator) made from crystals is used, for example. The laser light generated from the first laser medium LM1 is intermittently emitted by the pulse oscillation from the output mirror 58 to the turning-back mirror 59. The emitted laser light is reflected upon the turning-back mirror 59, and enters one end of the second laser medium LM2.

The number of turning-back mirrors 55 and 56 used in the oscillator is one or more (2, in this example). Therefore, it is possible to downsize the oscillator in the direction in which the excitation light enters into the first laser medium LM1.

The remaining part of the excitation light separated by the beam splitter 52 is reflected upon the turning-back mirrors 61 and 62, and then enters the turning-back mirror 60 while being collected by the light collection lens 65. The turning-back mirror 60 is a mirror transmitting light entering one side and reflecting light entering the other side.

The excitation light that has entered the turning-back mirror 60 from the light collection lens 65 passes the turning-back mirror 60, and enters the other end of the second laser medium LM2. In this case, in the second laser medium LM2, the laser light directed from the one end to the other end of the second laser medium LM2 can be effectively amplified as compared to a case in which the excitation light enters the one end of the second laser medium LM2. In this manner, the second laser medium LM2 functions as an amplifier.

Further, as described above, the first laser medium LM1 and the second laser medium LM2 are arranged such that crystals of the both laser media are parallel with each other in the c-axial direction. With this, the laser light generated from the first laser medium LM1 is more effectively amplified by the second laser medium LM2.

Moreover, the second laser medium LM2 may be manufactured, for example, by coupling two or more crystals of $Nd:YVO_4$ or Nd:YAG. With this, the laser light entering the second laser medium LM2 can be amplified by a greater degree. Accordingly, it is possible to increase an output of the laser light.

The laser light emitted from the other end of the second laser medium LM2 is reflected upon the turning-back mirror 60, and directed toward the beam expander 70.

It is difficult to cause pulse oscillation of the high-power laser light by the Q switch 50Q. Therefore, with the laser light output unit 50, the output of the excitation light separated toward the turning-back mirror 53 by the beam splitter 52 is set, for example, to be 35 W or lower. In this case, it is possible to accurately cause pulse oscillation of the laser light, and to make a beam diameter of the laser light emitted from the oscillator be 1.5 times of an ideal beam diameter or smaller.

Further, in the cases of the laser light output unit 50, it is preferable that the output of the excitation light separated toward the turning-back mirror 61 by the beam splitter 52 is, for example, 35 W or lower. In this case, an occurrence of a thermal lens effect due to excessively high energy of the excitation light entering the second laser medium LM2 is prevented. With this, it is possible to cause the laser light having a desired beam diameter and a desired intensity distribution to be emitted stably from the other end of the second laser medium LM2.

The beam expander 70 includes an input lens 71 and an output lens 72. The input lens 71 is configured by a plano-concave lens, and the output lens 72 is configured by a planoconvex lens. A beam diameter of the laser light emitted from the laser light output unit 50 is small. Therefore, the beam expander 70 adjusts the beam diameter of the laser light that has entered to be suitable as laser light that enters the focal position adjusting unit 80. With this, it is possible to correctly adjust the beam diameter of the laser light applied to the workpiece W at high accuracy. Here, when it is not required to adjust the beam diameter of the laser light applied to the workpiece W at high accuracy, the beam expander 70 may not necessarily be provided.

The beam sampler 21 transmits a part of the laser light emitted from the beam expander 70, and reflects the remaining part of the laser light. The laser light reflected upon the beam sampler 21 enters the power monitor 110. The power monitor 110 includes an output detector for detecting an output (energy) of the laser light emitted from the laser light output unit 50, and supplies a detection result from the output detector to the control unit 10 illustrated in FIG. 2. As the output detector, a thermopile or a photodiode is used, for example.

The control unit 10 illustrated in FIG. 2 has the detection result supplied from the output detector be displayed in the display unit 3 illustrated in FIG. 2, for example. With this, it is possible for the user to easily confirm an operational state of the laser light output unit 50 by looking at the display unit 3.

As the beam sampler 21, a glass plate without being subjected to a surface treatment such as coating may be used, for example. In this case, the beam sampler 21 is not susceptible to a temperature change. Therefore, it is possible to monitor the output of the laser light emitted from the laser light output unit 50 at low cost and at high accuracy.

Here, the laser light emitted from the laser light output unit 50 is linearly-polarized light. In this embodiment, the bend mirror 22 is arranged such that the linearly-polarized laser light emitted from the laser light output unit 50 enters the bend mirror 22 with P polarization.

The bend mirror 22 is a mirror transmitting light entering one side and reflecting light entering the other side, and reflects the linearly-polarized laser light entering with P polarization toward the polarizing beam splitter 23 without changing its state of polarization.

The polarizing beam splitter 23 reflects laser light entering with S polarization, and transmits laser light entering with P polarization. Further, the polarizing beam splitter 23 is arranged such that the linearly-polarized laser light reflected upon the bend mirror 22 enters the polarizing beam splitter 23 with S polarization. With this, the polarizing beam splitter 23 reflects the linearly-polarized laser light entering with S polarization toward the focal position adjusting unit 80 without changing its state of polarization.

The focal position adjusting unit 80 includes an input lens 81, a collimator lens 82, an output lens 83, and a lens driving unit 89. The input lens 81 is configured by a plano-concave lens, and each of the collimator lens 82 and the output lens 83 is configured by a plano-convex lens. The input lens 81, the collimator lens 82, and the output lens 83 are arranged such that their optical axes are identical. The laser light reflected upon the polarizing beam splitter 23 toward the focal position adjusting unit 80 is directed so as to pass the input lens 81, the collimator lens 82, the output lens 83, and then toward the turning-back mirror 24.

Here, in the focal position adjusting unit 80, the lens driving unit 89 moves the input lens 81 in an optical axis direction. This changes a distance between the input lens 81 and the output lens 83, and thus changes a focal position of the laser light applied to the workpiece W. The focal position adjusting unit 80 and its operation will be described later in detail.

The turning-back mirror 24 reflects the linearly-polarized laser light emitted from the focal position adjusting unit 80 toward the quarter wave plate 25 without changing its state of polarization. The quarter wave plate 25 is configured, for example, by quartz, and is preferably configured such that a phase lag of laser light entering and passing the quarter wave plate 25 is $45°+n×360°$ (n is an integer). The quarter wave plate 25 may be manufactured, for example, by bonding two quartz plates such that their optical axes are orthogonal to each other.

In the quarter wave plate 25, the linearly-polarized laser light directed from the turning-back mirror 24 is converted into circularly-polarized laser light. When the quarter wave plate 25 having a phase lag of $45°+n×360°$ (n=0) is used, it is possible to correctly convert the linearly-polarized laser light into circularly-polarized laser light regardless of a temperature of the quarter wave plate 25. In this embodiment, the polarizing beam splitter 23 and the quarter wave plate 25 function as a polarization state converting unit of the laser light.

The laser light that has been converted into circularly-polarized light enters the scanning unit 200. The scanning unit 200 includes a first galvano mirror G1, a second galvano mirror G2, a first motor M1, and a second motor M2. The laser light that has entered the scanning unit 200 is reflected upon the first galvano mirror G1 and the second galvano mirror G2, and passes the cover glass 26 to be applied to a surface of the workpiece W.

The first galvano mirror G1 and the second galvano mirror G2 are configured such that the laser light reflected upon the first galvano mirror G1 and the second galvano mirror G2 becomes circularly-polarized laser light. In other words, the first galvano mirror G1 and the second galvano mirror G2 are configured such that a polarization state of the laser light entering the scanning unit 200 and a polarization state of the laser light emitted from the scanning unit 200 are equal. The circularly-polarized laser light emitted from the scanning unit 200 is applied to the workpiece W. The scanning unit 200 will be described later in detail.

The first galvano mirror G1 is driven by the first motor M1, and the second galvano mirror G2 is driven by the second motor M2. With this, the laser light applied to the surface of the workpiece W is scanned in two directions that are orthogonal to each other, and marking (printing) such as a line segment is performed to the surface of the workpiece W.

At the marking head 2, visible light around the workpiece W that is different from the laser light enters the scanning unit 200 through the cover glass 26. Further, the visible light that has entered the scanning unit 200 is reflected upon the first galvano mirror G1 and the second galvano mirror G2, and passes the quarter wave plate 25 to enter the turning-back mirror 24.

Here, the turning-back mirror 24 is configured so as to reflect light of a wavelength of the laser light emitted from the laser light output unit 50, and transmit light of a previously determined wavelength excluding the wavelength of the laser light. In this embodiment, the wavelength of the laser light is 1064 nm, and the previously determined wavelength is a wavelength in a visible light region (a region of wavelengths from 400 nm to 800 nm, inclusive). With this, at least a part of the visible light entering the turning-back mirror 24 passes the turning-back mirror 24.

In this embodiment, the imaging device 120 is provided so as to receive the visible light passing the turning-back mirror 24. The imaging device 120 is, for example, a CCD (charge-coupled device) camera including an imaging element and a lens.

In this case, in the imaging device 120, an image of the surface of the workpiece W is captured by the visible light entering the scanning unit 200 through the cover glass 26. An output signal from the imaging device 120 is supplied to the control unit 10 illustrated in FIG. 2. With this, image data corresponding to the image of the surface of the workpiece W is generated. Based on the generated image data, the image of the surface of the workpiece W is displayed in the display unit 3. Therefore, the user can confirm a position at which marking is to be performed on the surface of the workpiece W while looking at the display unit 3.

Further, as the turning-back mirror 24 reflects the light of the wavelength of the laser light emitted from the laser light output unit 50, it also reflects returning light that will be later described. Therefore, high-power laser light or returning light does not enter the imaging device 120. With this, it is possible to prevent the imaging device 120 from being broken due to high-power laser light or returning light.

It should be noted that the bend mirror 22 is irradiated with red guide light of a wavelength of about 620 nm on a side opposite of a side to which the laser light enters. The guide light passes the bend mirror 22, and is applied to the workpiece W through the same path as that of the laser light emitted from the laser light output unit 50. With this, it is possible for the user to easily confirm a position at which marking by the laser light is to be performed by looking at the red guide light applied to the workpiece W.

(4) Returning Light

At least a part of the laser light applied to the workpiece W is reflected upon the surface of the workpiece W, and then enters the cover glass 26. In the following description, the laser light reflected upon the surface of the workpiece W and entering the cover glass 26 is referred to as returning light. If the returning light enters the laser light output unit 50, there is possibly a case in which the first laser medium LM1 and the second laser medium LM2 within the laser light output unit 50 become broken. Thus, the polarizing beam splitter 23 and the quarter wave plate 25 are used in order to prevent the returning light from entering the laser light output unit 50. A mechanism how this works will be described.

The circularly-polarized laser light reflected upon the surface of the workpiece W enters the scanning unit 200 as returning light in a state in which its rotational direction is inverted. As described above, the scanning unit 200 is configured such that the polarization state of the laser light entering the scanning unit 200 and the polarization state of the laser light emitted from the scanning unit 200 are equal. With this, the returning light of the circularly-polarized light whose rotational direction is inverted enters the quarter wave plate 25 through the scanning unit 200. In this case, in the quarter wave plate 25, the returning light of the circularly-polarized light is converted into returning light of the linearly-polarized light. At this time, a phase of the returning light of the linearly-polarized light is shifted from a phase of the linearly-polarized laser light emitted from the laser light output unit 50. Specifically, a polarization plane of the returning light of the linearly-polarized light is rotated by 90° with respect to a polarization plane of the linearly-polarized laser light emitted from the laser light output unit 50. With this, the returning light of the linearly-polarized light converted by the quarter wave plate 25 enters the polarizing beam splitter 23 with P polarization.

The polarizing beam splitter 23 described above reflects light entering with S polarization, and transmits light entering with P polarization. Therefore, the returning light of the linearly-polarized light entering the polarizing beam splitter 23 with P polarization passes the polarizing beam splitter 23 as indicated by a thick dotted line in FIG. 5. In other words, the returning light is diverted from the path of the laser light. With this, the returning light does not enter the laser light output unit 50. As a result, it is possible to prevent the first laser medium LM1 and the second laser medium LM2 within the laser light output unit 50 from being broken.

(5) Scanning Unit

Figure 6:
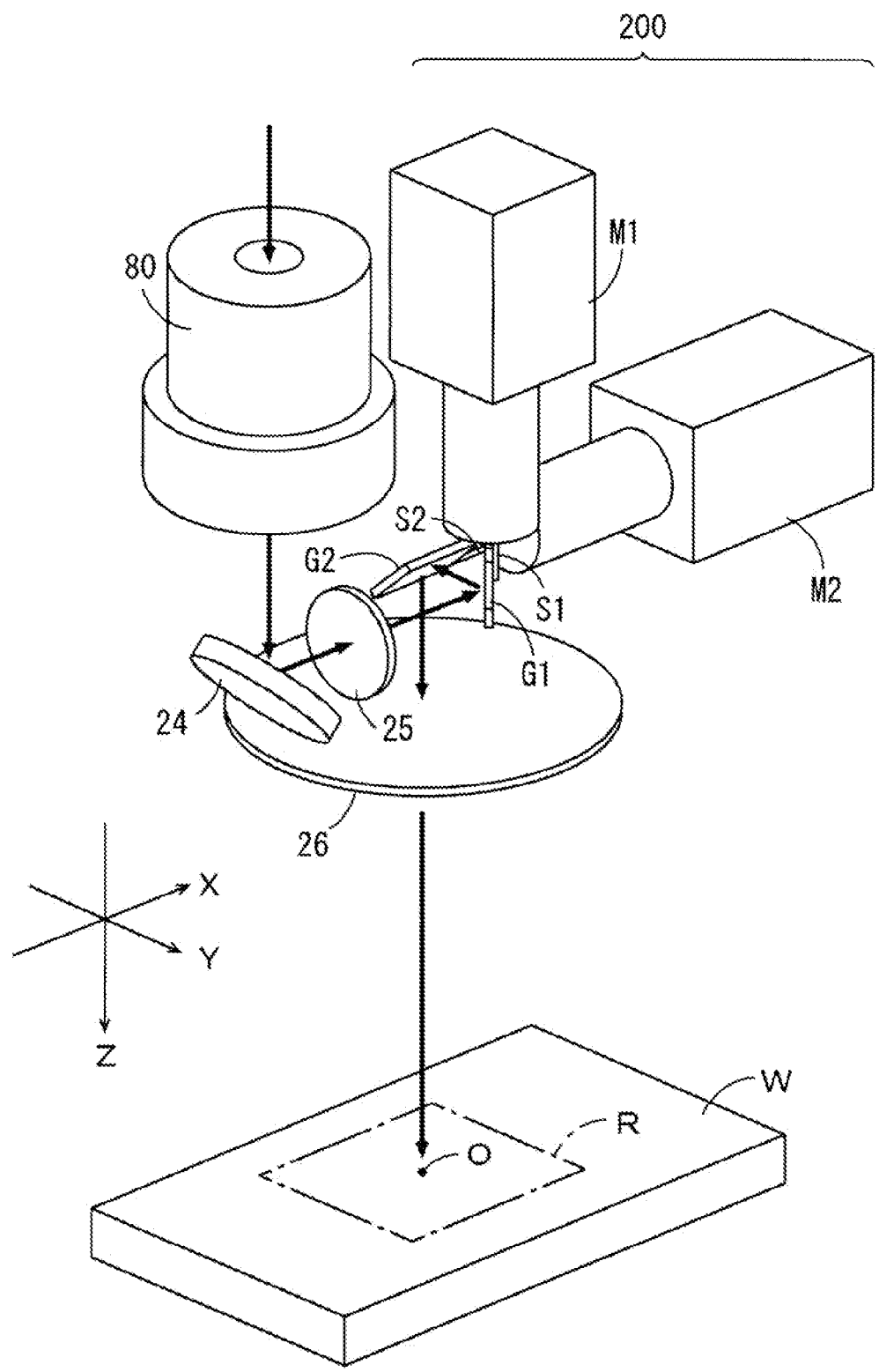
FIG. 6 is an external perspective view illustrating a configuration of a scanning unit and members around the scanning unit.

The scanning unit 200 will be described in detail. FIG. 6 is an external perspective view illustrating a configuration of the scanning unit 200 and members around the scanning unit 200. In the following description, a direction in which laser light is scanned over the workpiece W by the first galvano mirror G1 is referred to as an X direction, a direction in which laser light is scanned over the workpiece W by the second galvano mirror G2 is referred to as a Y direction, and a direction orthogonal to the X direction and the Y direction is referred to as a Z direction. Further, the center of a range R over which laser light may be scanned by the scanning unit 200 is referred to as an origin O.

As illustrated in FIG. 6, the focal position adjusting unit 80 is arranged so that its optical axis is parallel to the Z direction. Further, the turning-back mirror 24 is arranged so as to reflect the laser light emitted from the focal position adjusting unit 80 in the X direction.

According to the scanning unit 200 of this embodiment, the first galvano mirror G1 is held by a rotary shaft S1 extending from the first motor M1 in parallel to the Z direction in a manner rotatably about the rotary shaft S1. The second galvano mirror G2 is held by a rotary shaft S2 extending from the second motor M2 in parallel to the X direction in a manner rotatably about the rotary shaft S2.

The first galvano mirror G1 is arranged such that the circularly-polarized laser light converted by the quarter wave plate 25 enters the first galvano mirror G1 at an incident angle of 45° in a state in which the origin O is irradiated with the laser light. Further, the second galvano mirror G2 is arranged such that the laser light reflected upon the first galvano mirror G1 enters the second galvano mirror G2 at an incident angle of 45° in a state in which the origin O is irradiated with the laser light.

In this case, the laser light that has entered the first galvano mirror G1 with P polarization is reflected upon the first galvano mirror G1, and enters the second galvano mirror G2 with S polarization. Further, the laser light that has entered the first galvano mirror G1 with S polarization is reflected upon the first galvano mirror G1, and enters the second galvano mirror G2 with P polarization.

The first galvano mirror G1 and the second galvano mirror G2 are configured such that phase lags of light entering and reflected upon the mirrors with P polarization are equal, and that phase lags of light entering and reflected upon the mirrors with S polarization are equal.

Here, the phase lags of the laser light entering and reflected upon the first galvano mirror G1 and the second galvano mirror G2 with P polarization is assumed to be $\phi p$. Further, the phase lags of the laser light entering and reflected upon the first galvano mirror G1 and the second galvano mirror G2 with S polarization is assumed to be φs. At this time, a phase lag of (φp+φs) is generated in laser light entering the first galvano mirror G1 with P polarization and reflected upon the first galvano mirror G1 and the second galvano mirror G2. Further, a phase lag of (φs+φp) is generated in laser light entering the first galvano mirror G1 with S polarization and reflected upon the first galvano mirror G1 and the second galvano mirror G2.

As described above, a sum of the phase lag generated in the laser light entering and reflected upon the first galvano mirror G1 with P polarization and the phase lag generated in the laser light entering and reflected upon the second galvano mirror G2 with S polarization is equal to a sum of the phase lag generated in the laser light entering and reflected upon the first galvano mirror G1 with S polarization and the phase lag generated in the laser light entering and reflected upon the second galvano mirror G2 with P polarization. In this case, the laser light entering the scanning unit 200 is applied to the workpiece W from the scanning unit 200 in a state in which its polarization state is maintained.

Therefore, circularly-polarized laser light entering the first galvano mirror G1 of the scanning unit 200 is reflected upon the second galvano mirror G2 as circularly-polarized laser light, and applied to the workpiece W.

In the example shown in FIG. 6, positions of the first galvano mirror G1 and the second galvano mirror G2 with respect to the laser light are determined so as to make the polarization state of the laser light entering the scanning unit 200 and the polarization state of the laser light applied to the workpiece W equal. The configuration for making the polarization state of the laser light entering the scanning unit 200 and the polarization state of the laser light applied to the workpiece W equal is not limited to the above example.

For example, reflection surfaces for laser light of the first galvano mirror G1 and the second galvano mirror G2 may be subjected to a zero-shift coating treatment. Here, the zero-shift coating treatment refers to a treatment in which a predetermined film such as a dielectric multi-layer is formed over the reflection surface of the mirror, so that a relation of α=β+n×360° (n is an integer) is satisfied, where a phase lag of light entering with P polarization and reflected upon a reflection surface of the mirror is a, and a phase lag of light entering with S polarization and reflected upon a reflection surface of the mirror is β.

In this case, for either of the first galvano mirror G1 and the second galvano mirror G2, the phase lag α of the laser light entering with P polarization and reflected and the phase lag β of the laser light entering with S polarization and reflected are substantially equal. Therefore, circularly-polarized laser light entering the scanning unit 200 is reflected as the circularly-polarized laser light without being converted by the first galvano mirror G1. Further, the circularly-polarized laser light reflected upon the first galvano mirror G1 is reflected as the circularly-polarized laser light without being converted by the second galvano mirror G2. With this, the circularly-polarized laser light is applied to the workpiece W.

As described above, when the zero-shift coating treatment is applied to the first galvano mirror G1 and the second galvano mirror G2, it is not necessary to adjust the incident angle of the laser light entering the mirrors to 45°. Accordingly, a degree of freedom for a layout of the first motor M1 and the second motor M2 increases. In this embodiment, it is preferable that the incident angle of the laser light entering the first galvano mirror G1 and the second galvano mirror G2 in the state in which the origin O is irradiated with the laser light is set to be 30° or greater and 60° or smaller, and more preferably to 45°.

(6) Focal Position Adjusting Unit

Figure 7:
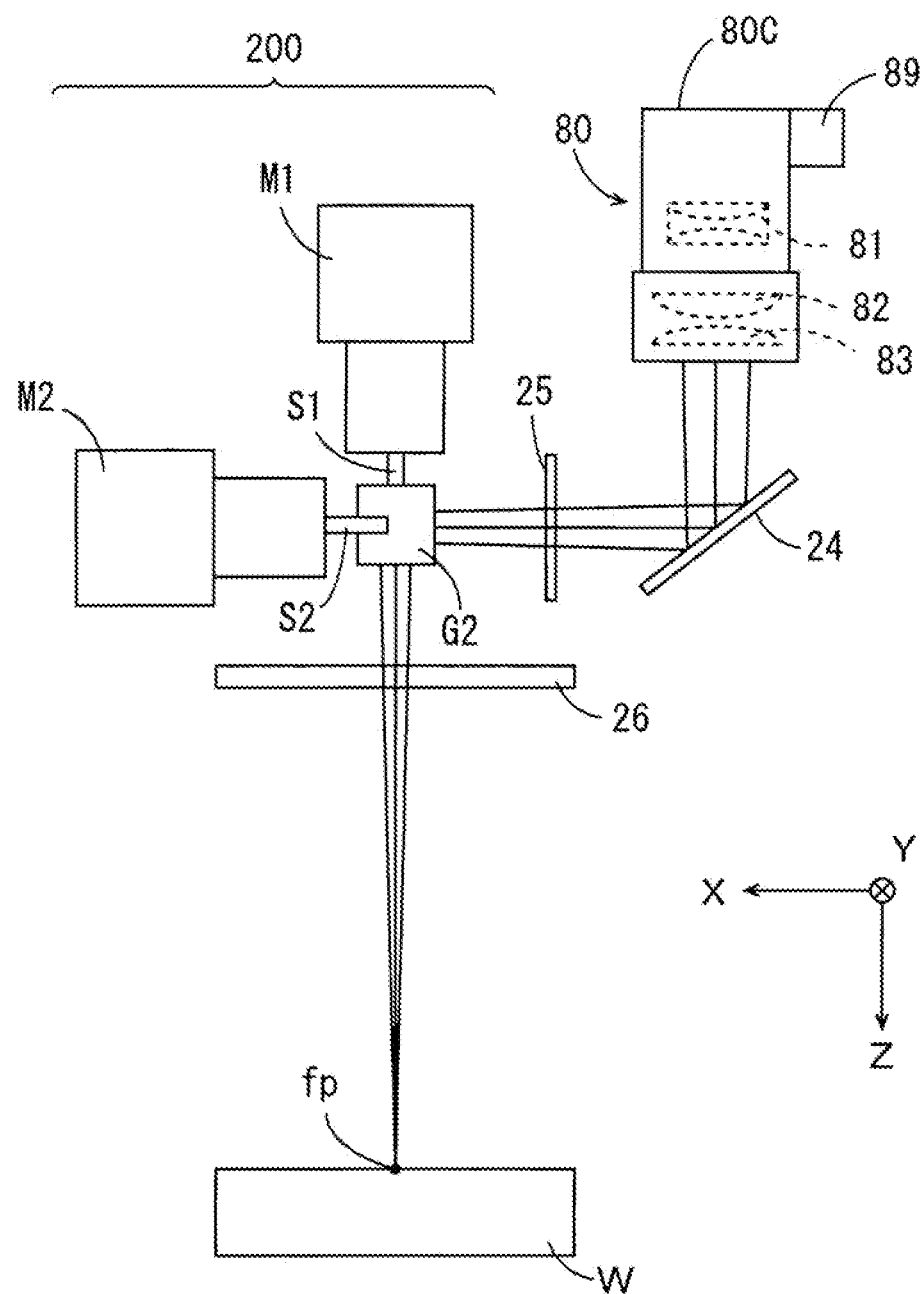
FIG. 7 is a side view for illustrating an example in which a focal position adjusting unit changes a focal position of laser light to be applied to a workpiece.
Figure 8:
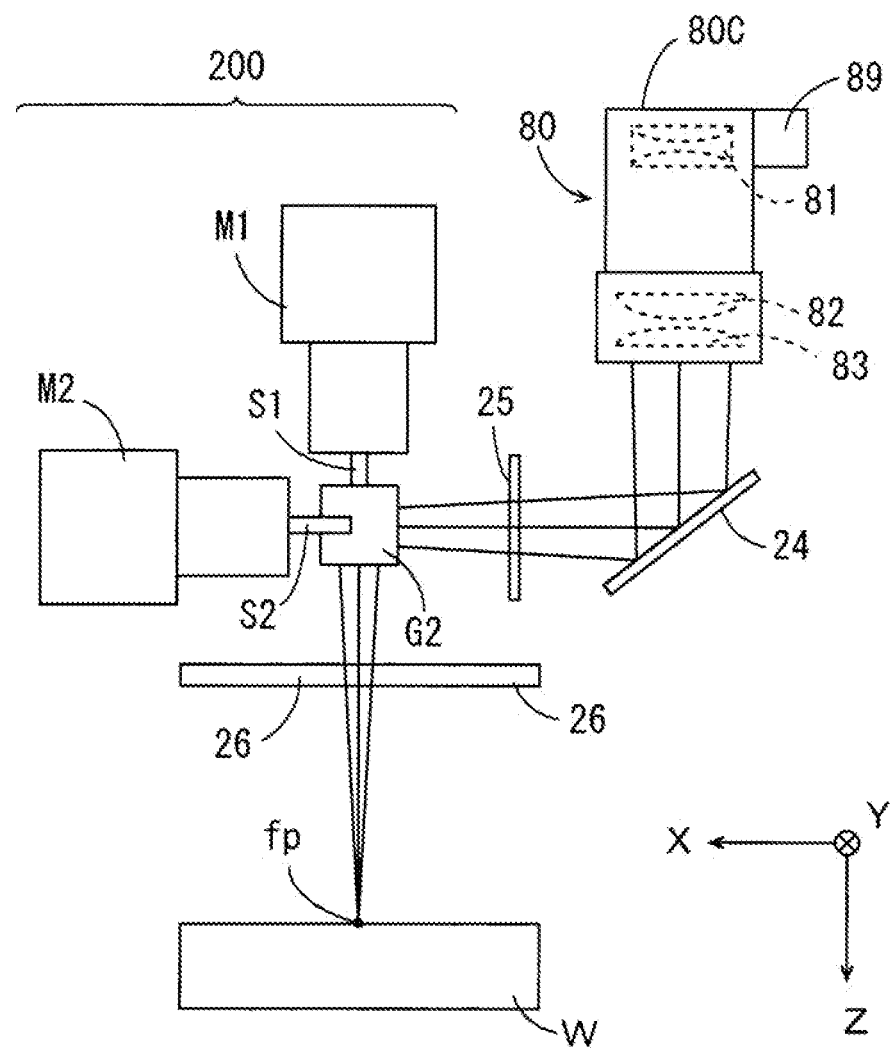
FIG. 8 is a side view for illustrating the example in which the focal position adjusting unit changes a focal position of laser light to be applied to the workpiece.

FIGS. 7 and 8 are side views for illustrating an example in which the focal position adjusting unit 80 changes a focal position of laser light to be applied to the workpiece W. FIGS. 7 and 8 show side views of the scanning unit 200, the quarter wave plate 25, and the cover glass 26, along with the focal position adjusting unit 80.

As illustrated in FIGS. 7 and 8, the focal position adjusting unit 80 includes a substantially-cylindrical casing 80C. Openings for transmitting laser light are provided on both ends of the casing 80C. Within the casing 80C, the input lens 81, the collimator lens 82, and the output lens 83 are arranged in the Z direction in the stated order.

Out of the input lens 81, the collimator lens 82, and the output lens 83, the collimator lens 82 and the output lens 83 are fixed within the casing 80C. On the other hand, the input lens 81 is provided movably in the Z direction. The lens driving unit 89 includes a motor, for example, and moves the input lens 81 in the Z direction. With this, a relative distance between the input lens 81 and the output lens 83 changes.

For example, an adjustment may be made by the lens driving unit 89 to make the distance between the input lens 81 and the output lens 83 smaller. In this case, as illustrated in FIG. 7, as a collection angle for the laser light emitted from the output lens 83 becomes smaller, a distance between a focal position fp of the laser light applied to the workpiece W and the cover glass 26 increases. On the other hand, an adjustment may be made by the lens driving unit 89 to make the distance between the input lens 81 and the output lens 83 larger. In this case, as illustrated in FIG. 8, as the collection angle for the laser light emitted from the output lens 83 becomes larger, the distance between the focal position fp of the laser light applied to the workpiece W and the cover glass 26 decreases.

The focal position adjusting unit 80 may be configured such that out of the input lens 81, the collimator lens 82, and the output lens 83, the input lens 81 is fixed within the casing 80C, and the collimator lens 82 and the output lens 83 are provided movably in the Z direction. In this case, the lens driving unit 89 may move the collimator lens 82 and the output lens 83 in the Z direction relative to the input lens 81. Further, the input lens 81, the collimator lens 82, and the output lens 83 may be configured to move in the Z direction relative to each other.

In this embodiment, the lens driving unit 89 of the focal position adjusting unit 80 is used as means for scanning laser light in the Z direction.

(7) Operation of Laser Marking Device

In the laser processing system 1000 illustrated in FIG. 1, for example, the laser processing data generated by the laser processing data setting device 900 illustrated in FIG. 1 is stored in the memory unit 20 illustrated in FIG. 2. The control unit 10 illustrated in FIG. 2 reads the laser processing data stored in the memory unit 20 to perform marking to the workpiece W. In the example described below, an operation of the laser marking device 100 illustrated in FIG. 1 in a case in which a letter "A" having three line segments is marked on the workpiece W will be described.

Figure 9:
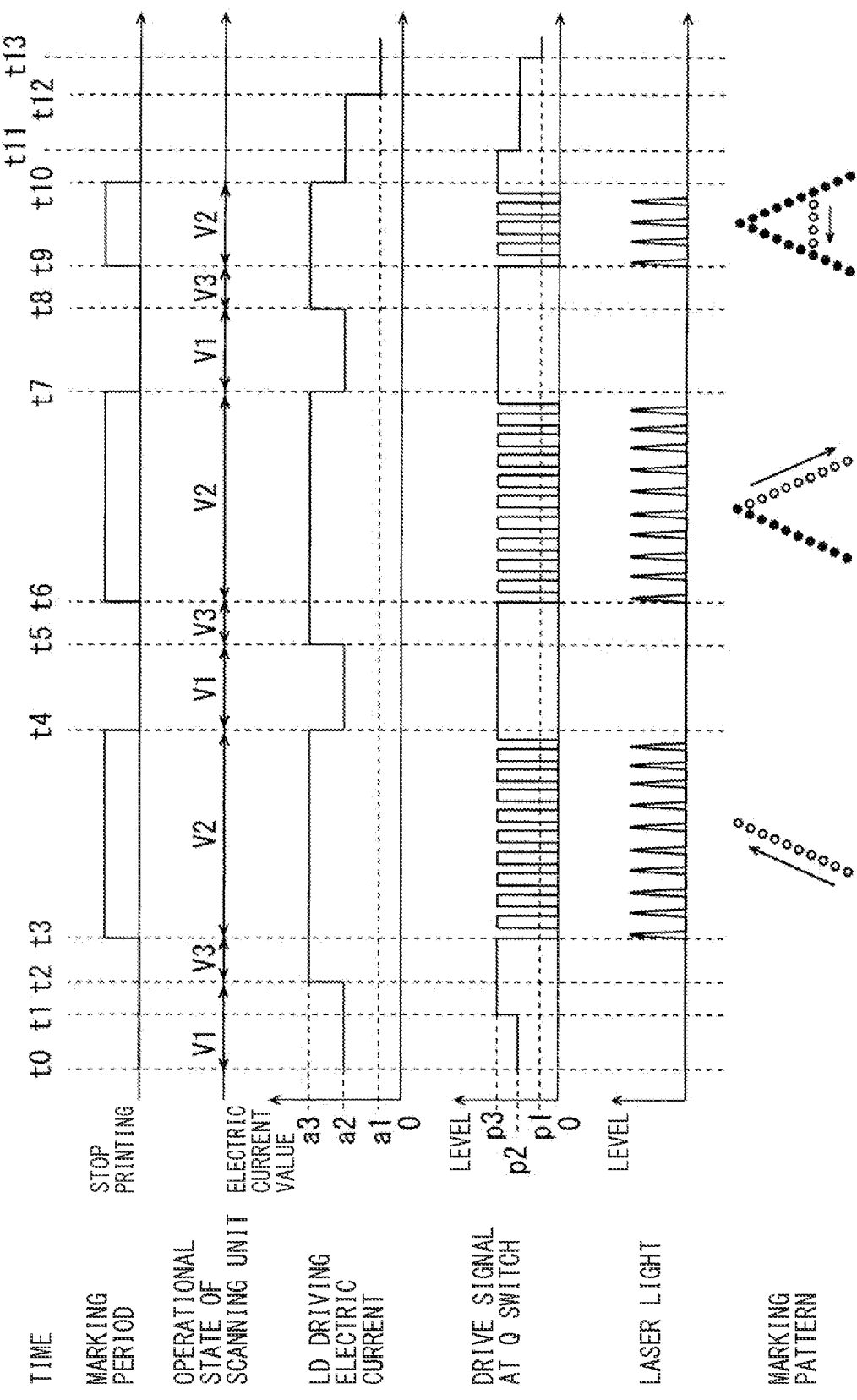
FIG. 9 is a timing chart showing an operation of a laser marking device when a letter "A" is marked on the workpiece.

FIG. 9 is a timing chart showing the operation of the laser marking device 100 when the letter "A" is marked on the workpiece W. In FIG. 9, an uppermost row indicates time, a second row indicates periods in which marking is performed, and a third row indicates an operational state of the scanning unit 200 illustrated in FIG. 5. Further, a fourth row indicates a value of electric current supplied to the plurality of single emitter LDs 41 illustrated in FIG. 2, and a fifth row indicates a signal level of a drive signal applied to the Q switch 50Q illustrated in FIG. 5. Finally, a sixth row indicates an output level of the laser light applied from the marking head 2 to the workpiece W, and a lowermost row indicates marking patterns marked on the workpiece W.

Here, the first motor M1 and the second motor M2 of the scanning unit 200 illustrated in FIG. 5 are configured to be operable in a first state V1, a second state V2, and a third state V3. The scanning unit 200 is assumed to be able to scan the laser light applied to the workpiece W in the X direction and the Y direction at a highest speed in the first state V1, and at a previously determined constant speed (hereinafter referred to as a marking speed) in the second state V2. The scanning unit 200 is also assumed to be able to, in the third state V3, make the scanning speed of the laser light applied to the workpiece W to be closer to the marking speed.

In an initial state, the plurality of single emitter LDs 41 illustrated in FIG. 2 are supplied with electric current of a previously determined magnitude. A value of the electric current at this time is referred to as a standby current value a2. The standby current value a2 is set in order to improve responsiveness when each of the single emitter LDs 41 is switched from an off state to an on state. Here, the off state of the single emitter LD 41 refers to a state in which the single emitter LD 41 generates light of an output smaller than a previously determined output or does not generate light at all. Further, the on state of the single emitter LD 41 refers to a state in which the single emitter LD 41 generates light of an output greater than or equal to the previously determined output.

Moreover, in the initial state, the Q switch 50Q illustrated in FIG. 5 is applied with a constant drive signal of a previously determined signal level. The signal level of the drive signal at this time is referred to as a standby level p2. The standby level p2 is set in order to improve responsiveness in an oscillating operation of the Q switch 50Q.

At time t0, the control unit 10 illustrated in FIG. 2 reads the laser processing data stored in the memory unit 20. Further, the control unit 10 determines marking periods for the respective three line segments constituting the letter "A" as indicated at the uppermost row in FIG. 9 based on the read processing data. In this example, respective line segments are marked during a period from time t3 to time t4, a period from time t6 to time t7, and a period from time t9 to time t10.

Moreover, at time t0, the control unit 10 causes the scanning unit 200 to shift to the first state V1, and controls the scanning unit 200. With this, the scanning unit 200 is operated such that a position of irradiation by laser light is directed to a position of the line segment to be first marked.

Next, at time t1, the control unit 10 changes a signal level of a drive signal applied to the Q switch 50Q from the standby level p2 to a high level p3.

Subsequently, at time t2, the control unit 10 causes the scanning unit 200 to shift to the third state V3, and controls the scanning unit 200. With this, the scanning unit 200 is operated such that the position of irradiation with laser light is directed to the position of the line segment to be first marked, as well as such that the scanning speed of the laser light becomes closer to the marking speed. Further, at time t2, the control unit 10 increases a value of electric current supplied to the plurality of single emitter LDs 41 from the standby current value a2 up to a set current value a3. The set current value a3 is set in order to turn the plurality of single emitter LDs 41 to the on state.

Then, at time t3, the control unit 10 applies a high-frequency drive signal to the Q switch 50Q. In this case, the drive signal applied to the Q switch 50Q is switched between at the high level p3 and a low level at a constant cycle. With this, during the period from time t3 to time t4, the laser light is applied to the workpiece W from the marking head 2.

Further, at time t3, the control unit 10 causes the scanning unit 200 to shift to the second state V2, and controls the scanning unit 200. With this, the scanning unit 200 is operated such that the position of irradiation with the laser light applied to the workpiece W moves from one end to the other end of the line segment to be first marked at the marking speed. As a result, as shown at the lowermost row in FIG. 9, the first line segment is marked on the workpiece W by a plurality of dots during the period from time t3 to time t4.

Next, at time t4, the control unit 10 decreases the value of electric current supplied to the plurality of single emitter LDs 41 from the set current value a3 down to the standby current value a2. Further, from time t4, the control unit 10 maintains the signal level of the drive signal applied to the Q switch 50Q constant at the high level p3.

Furthermore, at time t4, the control unit 10 causes the scanning unit 200 to shift to the first state V1, and controls the scanning unit 200. With this, the scanning unit 200 is operated such the position of irradiation with laser light is directed to a position of the line segment to be second marked.

Thereafter, from time t5 to time t7, the control unit 10 performs the same processing as that having been performed from time t2 to time t4. With this, as shown at the lowermost row in FIG. 9, the second line segment is marked on the workpiece W by a plurality of dots during the period from time t6 to time t7.

Subsequently, from time t8 to time t10, the control unit 10 performs the same processing as that having been performed from time t2 to time t4 as well as from time t5 to time t7. With this, as shown at the lowermost row in FIG. 9, the third line segment is marked on the workpiece W by a plurality of dots during the period from time t8 to time t10. In this manner, the letter "A" is completed.

Next, at time t10, the control unit 10 decreases the value of electric current supplied to the plurality of single emitter LDs 41 from the set current value a3 down to the standby current value a2. Further, from time t10, the control unit 10 maintains the signal level of the drive signal applied to the Q switch 50Q constant at the high level p3. In addition, at time t10, the control unit 10 stops the operation of the scanning unit 200.

Subsequently, at time t11, the control unit 10 changes the signal level of the drive signal applied to the Q switch 50Q from the high level p3 to the standby level p2. Moreover, at time t12, the control unit 10 decreases the value of electric current supplied to the plurality of single emitter LDs 41 from the standby current value a2 down to a power saving current value a1 that is smaller than the standby current value a2. Furthermore, at time t13, the control unit 10 changes the signal level of the drive signal applied to the Q switch 50Q from the standby level p2 to a power saving level p1 that is smaller than the standby level p2. In this manner, the marking of the letter "A" is completed.

As described above, in this example, the value of electric current supplied to the plurality of single emitter LDs 41 is increased up to the set current value a3 during the period in which the scanning unit 200 is either in the first state V1 or in the third state V3. In addition, the signal level of the drive signal applied to the Q switch 50Q is changed from the standby level p2 to the high level p3. With this, the plurality of single emitter LDs 41 and the Q switch 50Q are driven stably at the time when the marking of the line segments starts. As a result, it is possible to prevent a delay in response of the plurality of single emitter LDs 41 and the Q switch 50Q when the marking of the line segments starts.

(8) Effects (8-1) According to the laser marking device 100, the light emitted from single emitters of the respective single emitter LDs 41 of the laser excitation unit 40 is collected onto the one end face E1 of the optical fiber cable OC. In this case, the plurality of single emitter LDs 41 each having the single emitter can be arranged in a dispersed manner. With the single emitter LDs 41 arranged in a dispersed manner, heat generated during driving may be easily dissipated. This prevents life duration of the single emitter LDs 41 from becoming shorter due to heat generation. Further, by collecting the light emitted from the plurality of single emitter LDs 41 onto the one end face E1 of the optical fiber cable OC, the high-power excitation light is transmitted to the laser light output unit 50 of the marking head 2 through the optical fiber cable OC.

In the laser light output unit 50, the excitation light emitted from the other end face E2 of the optical fiber cable OC is separated by the beam splitter 52. The first laser medium LM1 is excited by a part of the excitation light that has been separated to generate the laser light. The generated laser light enters the second laser medium LM2. The remaining part of the excitation light separated by the beam splitter 52 enters the second laser medium LM2.

With this, the second laser medium LM2 is excited, and the laser light that has emitted from the first laser medium LM1 and entered the second laser medium LM2 is amplified.

In this case, as an output of the part of the excitation light separated by the beam splitter 52 is lower than an output of the excitation light collected onto the one end face E1 of the optical fiber cable OC, an occurrence of a thermal lens effect in the first laser medium LM1 is prevented. Further, as the laser light generated from the first laser medium LM1 is amplified by the remaining part of the excitation light separated by the beam splitter 52, an output of the laser light emitted from the laser light output unit 50 increases. Therefore, the high-power laser light is scanned over the surface of the workpiece W by the scanning unit 200. As a result, it is possible to perform laser processing by high-power laser light while preventing life duration of the plurality of single emitter LDs 41 from becoming shorter.

(8-2) In the marking head 2, the linearly-polarized laser light emitted from the laser light output unit 50 enters the polarizing beam splitter 23 with S polarization and reflected thereon. The linearly-polarized laser light reflected upon the polarizing beam splitter 23 is converted into the circularly-polarized laser light by the quarter wave plate 25. The converted circularly-polarized laser light is scanned over the surface of the workpiece W by the scanning unit 200.

The circularly-polarized laser light reflected upon the surface of the workpiece W enters the quarter wave plate 25 through the scanning unit 200 as returning light in the state in which its rotational direction is inverted. With this, the returning light of the circularly-polarized light is converted into the linearly-polarized light. At this time, the phase of the returning light of the linearly-polarized light is shifted from the phase of the linearly-polarized laser light emitted from the laser light output unit 50. With this, the returning light of the linearly-polarized light enters the polarizing beam splitter 23 with P polarization. In this case, the returning light passes the polarizing beam splitter 23, and does not enter the laser light output unit 50.

As a result, it is possible to perform laser processing by high-power laser light, as well as to prevent the laser light output unit 50 from being broken due to the returning light only with a simple configuration and at low costs.

(8-3) In laser processing of a metal, the metal is processed by energy of laser light being absorbed in the metal. When laser processing is performed to a surface of the metal, at least a part of the metal is deformed. For example, when a circular hole is to be provided in the surface of the metal by laser processing, a part of the metal irradiated with the laser light is deformed toward an irradiation direction of the laser light in a concaved manner during laser processing. In this case, a plane inclined to the laser light (hereinafter referred to as a concave inclined surface) is formed within a concaved portion.

When linearly-polarized laser light is used in such laser processing, laser light applied to the metal enters a part of the concave inclined surface with P polarization and the remaining part of the concave inclined surface with S polarization. Here, a magnitude of energy absorbed by the metal varies between a case in which laser light enters the surface of the metal with P polarization and a case in which laser light enters the surface of the metal with S polarization. Specifically, the magnitude of energy absorbed by the metal when the linearly-polarized laser light enters the surface of the metal with P polarization is greater than the magnitude of energy absorbed by the metal when the linearly-polarized laser light enters the surface of the metal with S polarization.

With this, energy absorbed by the part of the concave inclined surface increases, and energy absorbed by the remaining part of the concave inclined surface decreases. Therefore, the part of the concave inclined surface may be easily processed, while the remaining part of the concave inclined surface may not be easily processed. As a result, an elliptical hole, instead of circular, is provided in the surface of the metal.

By contrast, when circularly-polarized laser light is used to provide a circular hole in the surface of the metal, an entire part of the concave inclined surface formed during the laser processing is irradiated with laser light with P polarization and laser light with S polarization at the same ratio. With this, a circular hole is correctly provided. Therefore, processing accuracy (processing quality) of the laser processing is improved.

According to the marking head 2 described above, it is possible to perform marking to the workpiece W by the circularly-polarized laser light. With this, similarly to the example of the laser processing described above, it is possible to improve processing accuracy (processing quality) in marking.

(8-4) According to the laser excitation unit 40, the VBGs 49 are provided at the front of the respective single emitter LDs 41. With this, the wavelength of the light emitted from the single emitter LDs 41 through the VBGs 49 is restricted within the wavelength region including an excitation wavelength of the first laser medium LM1. Therefore, it is possible to efficiently excite the first laser medium LM1 based on the excitation light emitted from the laser excitation unit 40.

(8-5) In this embodiment, the main body 1 and the marking head 2 are connected via the one optical fiber cable OC. The excitation light emitted from the laser excitation unit 40 of the main body 1 is transmitted to the laser light output unit 50 of the marking head 2 via the optical fiber cable OC. With such a configuration, it is possible to downsize the marking head 2 that emits laser light.

(8-6) As described above, according to the laser light output unit 50, it is possible to cause pulse oscillation of the laser light by the Q switch 50Q. With this, it is possible to emit the high-power laser light with a short pulse width. Therefore, the surface of the workpiece W can be irradiated with the high-power laser light at very small time intervals. With this, it is possible to reduce time for performing marking to the workpiece W by the laser light.

(8-7) According to the marking head 2, the focal position of the laser light applied to the workpiece W is adjusted by the focal position adjusting unit 80. With this, it is possible to focus the high-power laser light on the surface of the workpiece W. As a result, it is possible to reduce time for performing marking to the workpiece W by the laser light, and to improve processing accuracy.

(8-8) The beam sampler 21 for detecting an output of the laser light emitted from the laser light output unit 50 is provided between the laser light output unit 50 and the polarizing beam splitter 23 along the path of the laser light. In this case, the returning light may not enter the beam sampler 21 as the returning light passes the polarizing beam splitter 23. With this, it is possible to prevent a part of the returning light from entering the power monitor 110 through the beam sampler 21. As a result, false detection by the power monitor 110 is prevented.

(9) Other Embodiments (9-1) In the embodiment described above, one laser medium (the second laser medium LM2) is provided as an amplifier for the laser light output unit 50. The number of laser media provided as an amplifier for the laser light output unit 50 is not limited to the above example. The laser light output unit 50 may be provided with two or more laser media as an amplifier.

Figure 10:
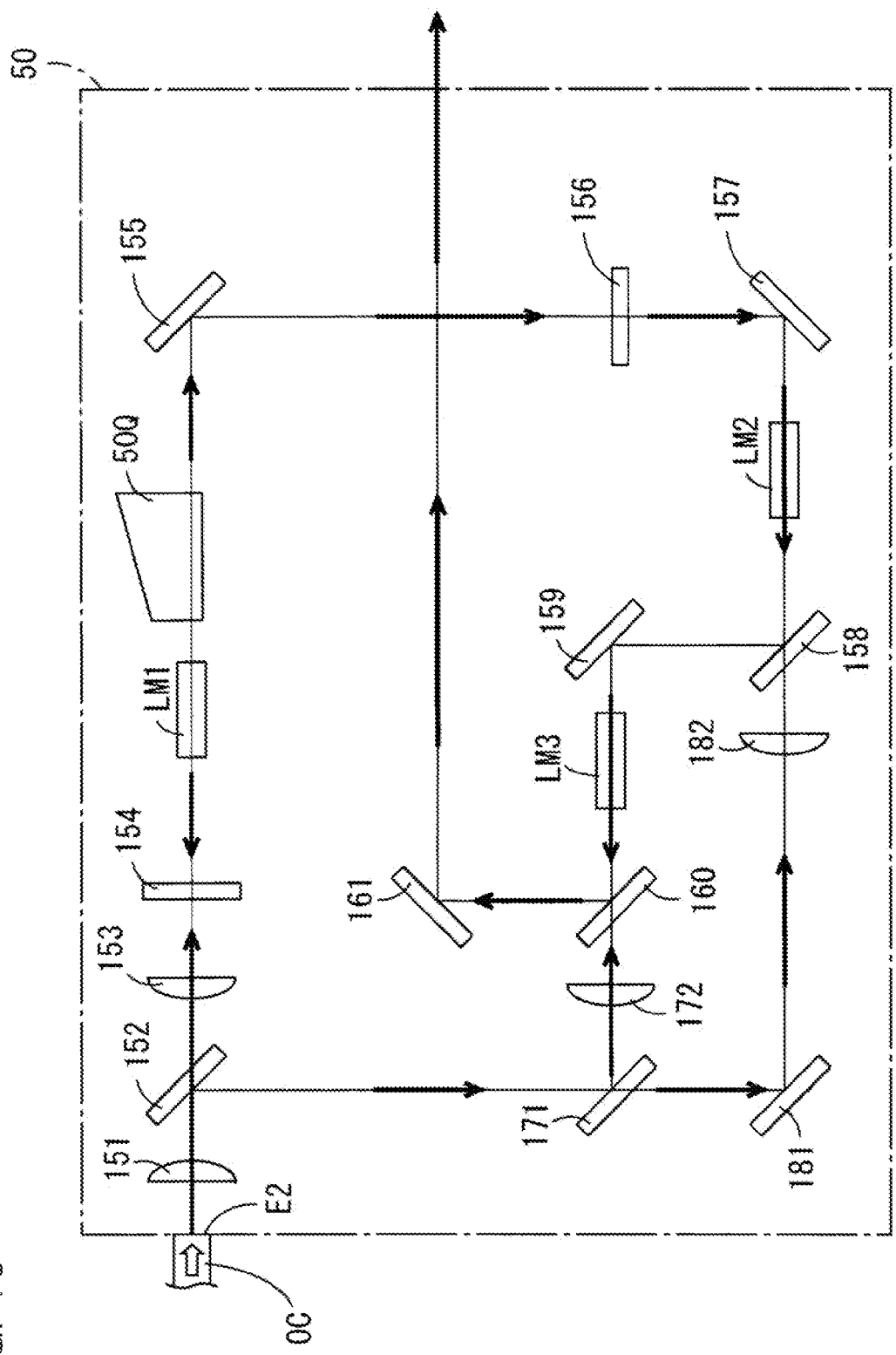
FIG. 10 is a block diagram illustrating a configuration of a laser light output unit according to another embodiment.

FIG. 10 is a block diagram illustrating a configuration of the laser light output unit 50 according to another embodiment. As illustrated in FIG. 10, the laser light output unit 50 of this example includes a collimator lens 151, beam splitters 152 and 171, light collection lenses 153, 172, and 182, a rear mirror 154, turning-back mirrors 155, 157, 158, 159, 160, 161, and 181, an output mirror 156, a first laser medium LM1, a second laser medium LM2, and a third laser medium LM3.

Out of the plurality of turning-back mirrors, the rear mirror 154 and the turning-back mirrors 158 and 160 are a mirror transmitting light entering one side and reflecting light entering the other side. Further, the first laser medium LM1, the second laser medium LM2, and the third laser medium LM3 have the same configuration as that of the first laser medium LM1 used in the embodiment described above. The first laser medium LM1, the second laser medium LM2, and the third laser medium LM3 are arranged such that crystals of these laser media are parallel with each other in the c-axial direction. Further, a Q switch 50Q used in this example has the same configuration and the same operation as those of the Q switch 50Q used in the embodiment described above.

Similarly, in this example, the high-power excitation light emitted from the other end face E2 of the optical fiber cable OC is adjusted into collimated light by the collimator lens 151, and enters the beam splitter 152. The excitation light that has entered the beam splitter 152 is separated into two directions that are orthogonal to each other.

A part of the excitation light separated by the beam splitter 152 passes the rear mirror 154 and enters the one end of the first laser medium LM1 while being collected by the light collection lens 153.

The excitation light that has entered the one end of the first laser medium LM1 causes the first laser medium LM1 to generate spontaneously emitted light (or induced emission light). The generated spontaneously emitted light is emitted from the other end of the first laser medium LM1. The spontaneously emitted light that has been emitted from the other end of the first laser medium LM1 is reflected upon the turning-back mirror 155 through the Q switch 50Q, and enters the output mirror 156. The output mirror 156 transmits a part of the entered spontaneously emitted light, and reflects the remaining part of the spontaneously emitted light. The spontaneously emitted light that has been reflected upon the output mirror 156 is reflected upon the turning-back mirror 155, and enters the other end of the first laser medium LM1 through the Q switch 50Q.

The spontaneously emitted light that has entered the other end of the first laser medium LM1 causes the first laser medium LM1 to generate induced emission light. The generated induced emission light is emitted from the one end of the first laser medium LM1. The induced emission light emitted from the one end of the first laser medium LM1 is reflected upon the rear mirror 154, and enters the one end of the first laser medium LM1.

Thereafter, the induced emission light is emitted from the other end of the first laser medium LM1, is reflected upon the turning-back mirror 155 through the Q switch 50Q, and enters the output mirror 156. At this time, the output mirror 156 transmits a part of the entered induced emission light, and reflects the remaining part of the induced emission light. The induced emission light that has been reflected upon the output mirror 156 is reflected upon the turning-back mirror 155, and enters the other end of the first laser medium LM1 through the Q switch 50Q. Thereafter, the induced emission light is emitted from the one end of the first laser medium LM1, is reflected upon the rear mirror 154, and again enters the one end of the first laser medium LM1.

Laser light is generated by the induced emission light repeatedly entering the first laser medium LM1 in this manner. The laser light generated in the first laser medium LM1 is intermittently emitted from the output mirror 156 toward the turning-back mirror 157 by the operation of the Q switch 50Q. The emitted laser light is reflected upon the turning-back mirror 157, and enters the one end of the second laser medium LM2.

As described above, in this embodiment, the rear mirror 154, the first laser medium LM1, the Q switch 50Q, the turning-back mirror 155, and the output mirror 156 function as an oscillator of laser light.

The remaining part of the excitation light separated by the beam splitter 152 enters the beam splitter 171. The excitation light that has entered the beam splitter 171 is further separated into two directions that are orthogonal to each other.

A part of the excitation light separated by the beam splitter 171 is reflected upon the turning-back mirror 181, and then passes the turning-back mirror 158 and enters the other end of the second laser medium LM2 while being collected by the light collection lens 182. With this, in the second laser medium LM2, the laser light directed from the one end to the other end is more effectively amplified by the excitation light incident from the other end. In this manner, the second laser medium LM2 functions as an amplifier.

The laser light amplified by the second laser medium LM2 is reflected upon the turning-back mirrors 158 and 159, and enters one end of the third laser medium LM3.

Here, the remaining part of the excitation light separated by the beam splitter 171 passes the turning-back mirror 160 and enters the other end of the third laser medium LM3 while being collected by the light collection lens 172. With this, in the third laser medium LM3, the laser light directed from the one end to the other end is more effectively amplified by the excitation light incident from the other end. In this manner, the third laser medium LM3 functions as an amplifier.

The laser light amplified by the second laser medium LM2 and the third laser medium LM3 is reflected upon the turning-back mirrors 160 and 161, and directed toward the beam expander 70 illustrated in FIG. 5.

In the example illustrated in FIG. 10, the laser light generated in the first laser medium LM1 is amplified by the second laser medium LM2 and the third laser medium LM3. In other words, the laser light generated by one oscillator may be amplified by each of two amplifiers. With this, it is possible to increase output power of the laser light applied to the workpiece W while reducing energy of the excitation light entering the first laser medium LM1.

(9-2) In the above embodiment, the quarter wave plate 25 is provided along the path of laser light so that the workpiece W is irradiated with circularly-polarized laser light. The configuration for irradiating the workpiece W with the circularly-polarized laser light in this manner is not limited to the above example. Instead of providing the quarter wave plate 25 along the path of laser light between the laser light output unit 50 and the scanning unit 200, one of the first galvano mirror G1 and the second galvano mirror G2 of the scanning unit 200 may be provided with a wave plate for converting linearly-polarized light into circularly-polarized light, and the other of the mirrors may be provided with zero-shift coating. In this case, linearly-polarized laser light is converted into circularly-polarized laser light by one of the mirrors, and the converted circularly-polarized laser light is applied to the workpiece W. Further, the returning light of the circularly-polarized light from the workpiece W is converted into linearly-polarized laser light when entering the one of the mirrors and reflected upon the mirror.

(9-3) In the above embodiment, the Q switch 50Q is provided between the first laser medium LM1 and the output mirror 58 along the path of laser light within the laser light output unit 50. However, the position of the Q switch 50Q is not limited to this example. Instead of the position between the first laser medium LM1 and the output mirror 58, the Q switch 50Q may be provided between the first laser medium LM1 and the rear mirror 57.

(9-4) The above embodiment describes the example in which the present invention is applied to the laser marking device. The present invention is not limited to the example, and may be applied to devices such as a device for providing a hole in the workpiece W, a device for trimming the workpiece W, or a device for scribing the workpiece W. As described above, the present invention may be utilized in various processing using laser light such as melting, peeling, oxidation, cutting, and tarnishing, other than marking.

(10) Correspondence Between Components in Claims and Components in Embodiments

Hereinafter, correspondence between components in claims and components in the embodiments will be described, although the present invention is not limited to the following example.

In the above embodiment, the workpiece W is an example of the object, the laser marking device 100 is an example of the laser processing device, the laser excitation unit 40 is an example of the excitation light generating unit, the optical fiber cable OC is an example of the excitation light transmission medium and the optical fiber cable, the laser light output unit 50 is an example of the laser light output unit, and the scanning unit 200 is an example of the laser light scanning unit.

Further, the single emitter LDs 41, the first single emitter LDs 41A and 41a, the second single emitter LDs 41B and 41b, and the third single emitter LD 41c are examples of the light source. The light collection lens 44 and the total reflection mirrors 45a and 45b, 45c, 45d, 45e, 45f are examples of the light collection optical mechanism, the beam splitter 52 is an example of the excitation light separator, and the first laser medium LM1 is an example of the first laser medium.

Moreover, the configuration including the turning-back mirrors 55 and 56, the rear mirror 57, the output mirror 58, the Q switch 50Q, and the first laser medium LM1 illustrated in FIG. 5, and the configuration including the rear mirror 154, the first laser medium LM1, the Q switch 50Q, the turning-back mirror 155, and the output mirror 156 illustrated in FIG. 10 are examples of the oscillator. The second laser medium LM2 and the third laser medium LM3 are examples of the second laser medium and the amplifier.

Furthermore, the casing 40C is an example of the casing, the VBG 49 is an example of the volume bragg grating, the main body 1 is an example of the main body, the marking head 2 is an example of the head, the rear mirror 57 and the output mirror 156 are examples of the first reflecting member, the output mirror 58 and the rear mirror 154 are examples of the second reflecting member, and the Q switch 50Q is an example of the Q switch.

In addition, the turning-back mirrors 59, 157, and 159 are examples of the first optical element, the turning-back mirrors 62 and 181 and the beam splitter 171 are examples of the second optical element, and the turning-back mirrors 60 and 161 are examples of the third optical element.

Finally, the focal position adjusting unit 80 is an example of the focal position adjusting unit, the input lens 81 is an example of the first lens, the output lens 83 is an example of the second lens, and the lens driving unit 89 is an example of the lens moving unit.

Various other components having the same configuration or function as defined in the claims may also be used as the components in the claim.

The present invention may be effectively utilized for processing an object using laser light.

What is claimed is:

1. A laser processing device for processing an object by irradiating the object with laser light, the device comprising:
   an excitation light generating unit configured to emit excitation light;
   an excitation light transmission medium having one end and the other end, and configured to transmit the excitation light emitted from the excitation light generating unit from the one end to the other end;
   a laser light output unit configured to emit laser light based on the excitation light transmitted through the excitation light transmission medium; and
   a laser light scanning unit configured to scan the laser light emitted from the laser light output unit over a surface of the object, wherein
   the excitation light generating unit includes:

a plurality of light sources each having a single light emitting spot for emitting excitation light; and a light collection optical mechanism configured to collect the excitation light emitted from the light emitting spots of the plurality of light sources onto the one end of the excitation light transmission medium, and the laser light output unit includes:

an excitation light separator configured to separate the excitation light emitted from the other end of the excitation light transmission medium into first excitation light and second excitation light;

an oscillator having a first laser medium excited by the first excitation light separated by the excitation light separator, a reflecting member disposed so as to reflect induced emission light emitted from a first end of the first laser medium toward the first end, and an output mirror disposed so as to reflect induced emission light emitted from a second end of the first laser medium toward the second end and emitting a part of induced emission light amplified by the first laser medium as the laser light, the oscillator configured to cause oscillation of the laser light by the reflecting member and the output mirror; and an amplifier having a second laser medium excited by the second excitation light separated by the excitation light separator, the amplifier configured to amplify the laser light emitted from the output mirror of the oscillator by the second laser medium.

2. The laser processing device according to claim 1, wherein the plurality of light sources of the excitation light generating unit are connected in series.

3. The laser processing device according to claim 1, wherein the excitation light generating unit further includes: a casing for containing the plurality of light sources and the light collection optical mechanism, and the plurality of light sources and the light collection optical mechanism are fixed within the casing.

4. The laser processing device according to claim 1, wherein the excitation light generating unit further includes: a plurality of volume bragg gratings provided for the respective light sources, and the volume bragg gratings each function as an external resonator of corresponding one of the light sources by reflecting excitation light in a previously determined wavelength region.

5. The laser processing device according to claim 4, wherein the previously determined wavelength region is a wavelength region of a constant width and including 879 nm, and the first laser medium generates laser light whose wavelength is 1064 nm based on excitation light whose wavelength is 879 nm.

6. The laser processing device according to claim 1, further comprising:

a main body including the excitation light generating unit; and a head provided separately from the main body, wherein the head includes the laser light output unit and the laser light scanning unit, and the excitation light transmission medium is an optical fiber cable connecting the main body and the head such that the excitation light generated by the excitation light generating unit is transmitted to the laser light output unit.

7. The laser processing device according to claim 1, wherein the oscillator further includes:

a Q switch disposed between the reflecting member and the output mirror.

8. The laser processing device according to claim 1, wherein the laser light emitted from the output mirror of the oscillator is transmitted from a third end of the second laser medium to a fourth end of the second laser medium in the amplifier, and the laser light output unit further includes a first optical element configured to reflect the second excitation light separated by the excitation light separator toward the fourth end of the second laser medium.

9. The laser processing device according to claim 8, wherein the laser light output unit further includes:

a third optical element configured to reflect the laser light emitted from the fourth end of the second laser medium toward the laser light scanning unit.

10. The laser processing device according to claim 1, further comprising:

a focal position adjusting unit provided between the laser light output unit and the laser light scanning unit, wherein the focal position adjusting unit includes:

a first lens and a second lens provided along a path of laser light from the laser light output unit to the laser light scanning unit; and a lens moving unit configured to adjust a focal position of the laser light applied to the object by changing a relative distance between the first lens and the second lens.

11. The laser processing device according to claim 8, wherein the laser light output unit further includes a second optical element configured to reflect the laser light emitted from the output mirror of the oscillator toward the third end of the second laser medium.

* * * * *